United States Patent

Kumamoto et al.

[11] Patent Number: 5,936,434
[45] Date of Patent: Aug. 10, 1999

[54] VOLTAGE COMPARATOR AND A/D CONVERTER

[75] Inventors: Toshio Kumamoto; Masao Ito; Takahiro Miki; Takashi Okuda, all of Tokyo, Japan

[73] Assignee: Mitsubishi Kabushiki Kaisha, Tokyo, Japan

[21] Appl. No.: 08/912,813

[22] Filed: Aug. 19, 1997

[30] Foreign Application Priority Data

Mar. 12, 1997 [JP] Japan ..................................... 9-057588

[51] Int. Cl.$^6$ ........................................... H03K 5/153
[52] U.S. Cl. ................................. 327/77; 327/93; 327/337
[58] Field of Search .......................... 330/9, 51; 327/63, 327/65, 77, 79, 91, 93, 337, 554; 341/158, 159, 160, 136

[56] References Cited

U.S. PATENT DOCUMENTS

| | | | |
|---|---|---|---|
| 4,197,472 | 4/1980 | Aoki et al. ................ | 327/64 |
| 4,989,003 | 1/1991 | Sauer ......................... | 327/77 |
| 5,010,338 | 4/1991 | Miki et al. ................. | 327/63 |
| 5,165,058 | 11/1992 | Nakatani et al. ......... | 327/63 |
| 5,565,800 | 10/1996 | Kobayashi ................ | 327/65 |

FOREIGN PATENT DOCUMENTS 62-271518  11/1987  Japan .
1-106517   4/1989   Japan .

OTHER PUBLICATIONS

T. Kumamoto et al., "An 8–bit High–Speed CMOS A/D Converter," *IEEE Journal of Solid–State Circuits*, vol. sc–21, No. 6, Dec. 1986, pp. 976–982.

*Primary Examiner*—Toan Tran
*Attorney, Agent, or Firm*—Burns, Doane, Swecker & Mathis, LLP

[57] ABSTRACT

An object is to obtain a voltage comparator capable of high-accuracy voltage comparison. An input voltage (VIN) and a reference voltage (VREF) are connected to one electrode of a capacitor (C1) through switches (S1) and (S2), respectively. The other electrode of the capacitor (C1) is connected to the input portion of an inverter (INV1). The output portion of the inverter (INV1) is connected to the input portion of an inverter (INV3) and is also fed back to the input through a switch (S3). An inverter (INV11) is further connected in parallel with the inverter (INV1), wherein the input/output characteristics of the inverters (INV1, INV3 and INV11) are set equal.

20 Claims, 27 Drawing Sheets

AZ PERIOD

COMPARISON PERIOD

VOLTAGE COMPARATOR AND A/D CONVERTER

BACKGROUND OF THE INVENTION

1. Field of the Invention

The present invention relates to a chopper type voltage comparator and a parallel type A/D converter using the same.

2. Description of the Background Art

FIG. 30 is a circuit diagram showing an example of a configuration of a conventional chopper type voltage comparator. As shown in FIG. 30, an input voltage VIN and a reference voltage VREF are connected to one electrode of a capacitor C1 through switches S1 and S2, respectively. The other electrode of the capacitor C1 is connected to the input portion of an inverter INV1. The output portion of the inverter INV1 is connected to one electrode of a capacitor C2 and is also fed back to the input through a switch S3. The other electrode of the capacitor C2 is connected to the input portion of an inverter INV2, whose output portion is connected to the input portion of an inverter INV3 and is also fed back to the input through a switch S4. The output VOUT of the inverter INV3 is provided to a latch circuit 11, and the latch output LOUT from the latch circuit 11 makes the output of the voltage comparator.

FIG. 31 is a circuit diagram showing the configuration in FIG. 30 in more detail. As shown in FIG. 31, the inverters INV1–INV3 each have a CMOS inverter configuration formed of a PMOS transistor QP and an NMOS transistor QN and the switches S1–S4 are each formed of a parallel connection of a PMOS transistor QP and an NMOS transistor QN. A control signal φ is applied to the gates of the NMOS transistors QN of the switches S1, S3 and S4 and to the gate of the PMOS transistor QP of the switch S2 and an inverse control signal $\bar{\phi}$ is applied to the gates of the PMOS transistors QP of the switches S1, S3 and S4 and to the gate of the NMOS transistor QN of the switch S2.

The latch circuit 11 is formed of switches SL1, SL2 and inverters INV4 and INV5, where the inverters INV4 and INV5 are connected in series, with the switch SL1 interposed between the input portion of the inverter INV4 and the output portion of the inverter INV3 and the switch SL2 interposed between the output portion of the inverter INV5 and the input portion of the inverter INV4. The inverter INV4 and the inverter INV5 each have a CMOS inverter configuration formed of a PMOS transistor QP and an NMOS transistor QN. The switches SL1 and SL2 are each formed of a parallel connection of a PMOS transistor QP and an NMOS transistor QN. The inverse control signal $\bar{\phi}$ is applied to the gates of the NMOS transistor QN of the switch SL1 and the PMOS transistor QP of the switch SL2 and the control signal φ is applied to the gates of the PMOS transistor QP of the switch SL1 and the NMOS transistor QN of the switch SL2.

With this configuration, the chopper type voltage comparator operates in two phases, a period called auto-zero and a comparison period. FIG. 32 is a diagram for use in describing its operation in the auto-zero period and FIG. 33 is a diagram for use in describing its operation in the comparison period. For convenience, the inverter INV2 and the switch S4 shown in FIG. 30 and FIG. 31 are not shown in these diagrams.

As shown in FIG. 32, in the auto-zero period (AZ period), the control signal φ is "H", so the switches S1 and S3 are on and the switch S2 is off. The switch SL1 is off and the switch SL2 is on, and hence the latch circuit 11 comes into a latch state.

In the AZ period, the input voltage VIN of analog form is applied to the one electrode (on the input side) of the capacitor C1 and the input and output of the inverter INV1 are shorted through the switch S3 in an on state, whose input voltage and output voltage match and get stabilized at the bias voltage Vb. As shown in FIG. 34, at the bias voltage Vb, the input voltage and the output voltage of the inverter are equal, with a high gain and a good gain characteristic, which is equal to VDD/2 (VDD: power-supply voltage).

On the other hand, as shown in FIG. 33, in the comparison period (COMP period), the control signal φ is "L", and so the switches S1 and S3 are off and the switch S2 is on. The switch SL1 in on and the switch SL2 is off, and hence the latch circuit 11 comes in a through state.

In the COMP period, the reference voltage VREF is applied to the one electrode of the capacitor C1 and the voltage change at this time (VIN→VREF) is transferred to the other electrode of the capacitor C1. In the inverter INV1, since the switch S3 is in an off state at this time, the voltage change on the input side of the inverter INV1 (on the side of the other electrode of the capacitor C1) is superimposed on the bias voltage Vb providing a high gain.

Accordingly, the inverter, having a high gain, detects even a small voltage change of the input, largely amplifies it, and transfers it to the next stage. FIG. 35 (comparison period) shows the change of the operating point at this time. This voltage change is further amplified in the inverter INV3 in the next stage and transferred to the inside of the latch circuit 11.

Subsequently, in the next AZ period, the latch circuit 11 determines the data as "H" or "L." This operation is repeated to compare the input voltage VIN and the reference voltage VREF.

FIG. 36 is a timing diagram showing the above-described comparing operation. As shown in this diagram, the output VOUT of the inverter INV3 goes to the bias voltage Vb in the AZ period and goes "H" or "L" in the COMP period, and the latch output LOUT of the latch circuit 11 shows, in the AZ period, the result of the comparison in the preceding COMP period.

While the chopper type voltage comparator operates basically as explained above, an offset voltage occurs in the comparison result if there is a mismatch in the characteristics of the inverters (amps). FIG. 37 and FIG. 38 show the principle.

The inverter INV1 which is shorted between the input and output in the AZ period is biased at the point where the voltages become equal at the input and the output. However, if the characteristic (L3) of the inverter INV3 in the next stage disagrees, even slightly, with the characteristic (L1) of the inverter INV1, the output voltage of the inverter INV3 is shifted from the bias voltage of the INV1 by VBERR.

When a transition is made from the state in which the output of the inverter INV3 is converging at (Vb+VBERR) in the AZ period to the comparison period to start the comparing operation, it is easy for the inverter INV3 to provide the result of "H" but it is difficult to provide the result of "L." As the result, as shown in FIG. 38, the latch output LOUT may change to erroneously output "H" in the AZ period in which it should originally output "L." When seen from the input side, it means occurrence of an offset voltage (VBERR). In the case of the configuration of FIG. 30 and FIG. 31, the same malfunction may occur also when there is a mismatch in input/output characteristic between the inverter INV2 and the inverter INV3.

To avoid the above-stated trouble, the individual inverters in the chopper type voltage comparator are made to have the same size, shape and orientation to produce the same characteristic. The size means the size of transistor, such as the channel length and the channel width, the shape means the configuration of the layout pattern, and the orientation means the direction of formation of the layout pattern.

Furthermore, since the inverters INV4 and INV5 in the latch circuit 11 function as amplifiers in the COMP period, they are usually formed of the same inverters as that for the inverter INV3 in the preceding stage. The offset voltage is usually reduced by using this configuration.

FIG. 39 is a circuit diagram showing a configuration of a parallel type A/D converter formed of a plurality of voltage comparators connected in parallel. As shown in this diagram, (n+1) ladder resistors LR1–LR(n+1) are provided in series between reference voltages VRT and VRB. In n voltage comparators CMP1–CMPn, the input voltage VIN is applied to one input of a voltage comparator CMPi (i=1 to n) and a reference tap voltage VRi obtained from a node between ladder resistors LRi and LR(i+1) is applied to the other input. The outputs from the voltage comparators CMP1–CMPn are provided to an encoder 12 and the encoder 12 outputs the encoded result EOUT on the basis of the outputs from the voltage comparators CMP1–CMPn.

In an A/D converter having this configuration, the voltage comparators CMP1–CMPn compare the input voltage VIN and their respective reference tap voltages VR1–VRn in parallel in synchronization with a certain clock. Then the encoder 12 encodes the comparison results from the voltage comparators CMP1–CMPn to output a digital signal, or the encoded result EOUT.

Accordingly, n=7 in the case of 3-bit A/D conversion, when the outputs of the voltage comparators CMP1–CMP3 are "L" and the outputs from the CMP4–CMP7 are "H" as shown in FIG. 39, the encoder 12 outputs "011" as the encoded result EOUT.

FIG. 40 is a circuit diagram showing a chopper type voltage comparator using differential amplifiers. In FIG. 40, the input voltage VIN and the reference voltage VREF are connected to one electrode of a capacitor C11 through switches S11 and S12, respectively. The other electrode of the capacitor C11 is connected to the first input portion of a differential amplifier AMP1. The first output of the differential amplifier AMP1 is connected to one electrode of a capacitor C12 and is also fed back to the first input through a switch S13. The other electrode of the capacitor C12 is connected to the first input portion of a differential amplifier AMP2. The first output portion of the differential amplifier AMP2 is connected to the first input portion of a differential amplifier AMP3 and is also fed back to the first input through a switch S14.

On the other hand, an inverse input voltage $\overline{VIN}$ and an inverse reference voltage $\overline{VREF}$ respectively in the opposite phases to the input voltage VIN and the reference voltage VREF are connected to one electrode of a capacitor C21 through switches S21 and S22, respectively. The other electrode of the capacitor C21 is connected to the second input portion of the differential amplifier AMP1 and the second output portion of the differential amplifier AMP1 is connected to one electrode of a capacitor C22 and is also fed back to the second input through a switch S23. The other electrode of the capacitor C22 is connected to the second input portion of the differential amplifier AMP2 and the second output portion of the differential amplifier AMP2 is connected to the second input portion of the differential amplifier AMP3 and is also fed back to the second input through a switch S24.

The output of the differential amplifier AMP3 (the first output or the second output) is provided to a latch circuit 13 and the latch output LOUT from the latch circuit 13 makes the output of the voltage comparator.

FIG. 41 is a circuit diagram showing an internal configuration of the differential amplifier AMP1 (AMP2, AMP2) formed of a differential pair of NMOS transistors. As shown in this diagram, PMOS transistors Q11 and Q12, receiving the power-supply voltage VDD at their respective sources in common and the constant voltage VPB at their respective gates in common, are connected to the drains of NMOS transistors Q13 and Q14 through nodes N11 and N12, respectively. The NMOS transistor Q13 and the NMOS transistor Q14 form a differential pair, which receives a first voltage V1 at the gate of the NMOS transistor Q13 and receives a second voltage V2 at the gate of the NMOS transistor Q14. The sources of the NMOS transistors Q13 and Q14 are grounded in common through an NMOS transistor Q15 receiving a constant voltage VBB at its gate. The drain (node N11) and the gate of the NMOS transistor Q13 are connected through the switch S13 and the drain (node N12) and the gate of the NMOS transistor Q14 are connected through the switch S23.

In the differential amplifier AMP1 having this configuration, the gate of the NMOS transistor Q13 serves as the first input portion, the node N11 as the first output portion, the gate of the NMOS transistor Q14 as the second input portion, and the node N12 as the second output portion.

FIG. 42 is a circuit diagram showing an internal configuration of the differential amplifier AMP1 (AMP2, AMP2) formed of a differential pair of PMOS transistors. As shown in this diagram, NMOS transistors Q21 and Q22, having their respective sources grounded in common and receiving a constant voltage VNB at their respective gates in common, are connected to the drains of PMOS transistors Q23 and Q24 through nodes N21 and N22, respectively. The PMOS transistor Q23 and the PMOS transistor Q24 form a differential pair, which receives the first voltage V1 at the gate of the PMOS transistor Q23 and receives the second voltage V2 at the gate of the PMOS transistor Q24. The sources of the PMOS transistors Q23 and Q24 are connected to the power-supply voltage VDD through a PMOS transistor Q25 receiving a constant voltage VPB at its gate. The drain (node N21) and the gate of the PMOS transistor Q23 are connected through the switch S23 and the drain (node N22) and the gate of the PMOS transistor Q24 are connected through the switch S13.

In the differential amplifier AMP1 having this configuration, the gate of the PMOS transistor Q23 serves as the first input portion, the node N21 as the first output portion, the gate of the PMOS transistor Q24 as the second input portion, and the node N22 as the second output portion.

The switches S11–S14 and the switches S21–S24 have the same internal configuration as the switches S1–S4 shown in FIG. 31. The switches S11, S13, S14, S21, S23 and S24 turn on when the control signal φ is "H" and the switches S12 and S22 turn on when the control signal it is "L."

The operation is basically the same as that of the chopper type voltage comparator shown in FIG. 30 formed of inverter amplifiers except that it handles differential signal, so it is not described again. However, it has the advantage that it is not affected by noise superimposed in the same phase because it handles differential signal, unlike the chopper type voltage comparator formed of inverter amplifiers.

Although it is ideal when forming a parallel type A/D converter as shown in FIG. 39 that the analog input and the reference voltage are both differential signals, fixed voltages may be supplied on one side, that is, instead of the inverse input voltage $\overline{\text{VIN}}$ and the inverse reference voltage $\overline{\text{VREF}}$ respectively in the opposite phases to the input voltage VIN and the reference voltage VREF and connected to the second input portion.

The conventional chopper type voltage comparator configured as explained above has the following three problems.

(1) When the frequency of the input voltage VIN, an analog signal, becomes high, the voltage VN1 at the input portion of the inverter amplifier INV1 is, in the AZ period, not fixed at the bias voltage Vb providing a good gain characteristic, but varies according to the input voltage VIN. (FIG. 43)

Hence, the comparison operation in the COMP period does not start at the high-gain bias voltage. This is equivalent to an offset in the initial value, which causes the phenomenon that one of "H" and "L" is easy to output and the other is difficult to output (offset voltage). For example, if it is set to (Vb+ERR) in the AZ period as shown in FIG. 44, the "H" level is easy to output and the "L" level is difficult to output. This may cause the latch output LOUT to output "H" when it should output "L," as shown by the dotted line in the period T22.

Preventing the input voltage VN1 to the inverter INV1 from varying with the input voltage VIN in the AZ period requires use of an inverter INV1 of larger size, leading to the necessity of use of larger inverters as the inverters INV2 and INV3 in and after the second stage, which results in an increase in the power consumption.

(2) When the capacitor C1 has voltage dependence, if the capacitance value is smaller in the COMP period than in the AZ period, the voltage change on the one electrode side (the input side) of the capacitor C1 is not correctly transferred to the other electrode side (the inverter INV1 side), which deteriorates the resolution of the voltage comparator. This may also cause distortion, for the capacitance value changes according to the input voltage VIN.

As to the voltage dependence of the capacitance, it is known that the structure shown in FIG. 45 formed of two layers of polysilicon (or metal layers) has no voltage dependence but the structure formed of an N+ diffusion layer and polysilicon shown in FIG. 46 has voltage dependence.

In FIG. 45, a first-layer polysilicon 33 and a second-layer polysilicon 34 are formed on a semiconductor substrate 35. The first-layer polysilicon 33 is connected to an input terminal 31 and the second-layer polysilicon 34 is connected to an output terminal 32. An oxide film is formed on a part (not shown) of the semiconductor substrate 35. Hence, a capacitor formation portion 36 is formed between the first-layer polysilicon 33 and the second-layer polysilicon 34.

In FIG. 46, an N⁺ diffusion region 38 is formed in the surface of a P⁺ semiconductor substrate 37 and a first-layer polysilicon 33 is formed on the semiconductor substrate 37. The input terminal 31 is connected to the N+ diffusion region 38 and the output terminal 32 is connected to the first-layer polysilicon 33. An oxide film is formed on a part (not shown) of the P³⁰ semiconductor substrate 37. Accordingly, a capacitor formation portion 39 is formed between the N³⁰ diffusion region 38 and the first-layer polysilicon 33.

FIG. 47 shows the voltage dependences of the capacitance values of the capacitors structured as shown in FIG. 45 and FIG. 46. In FIG. 47, L11 shows the voltage versus capacitance value change of the capacitor C1 formed of the two-layered polysilicon shown in FIG. 45 and L12 shows the voltage versus capacitance value change of the capacitor C1 having the MOS structure shown in FIG. 46. The voltage in FIG. 47 indicates a voltage at one electrode of the capacitor C1 with respect to that at the other electrode.

(3) With the latch circuit 11 (13) holding the previous comparison result at "H"or "L," the next comparison result is inputted to the latch circuit (in the amplifying process). Accordingly, as shown in FIG. 48, when the switches S1, S3, S4 and SL2 change from on to off and the switch S2 and the switch SL1 change from off to on, the previous held data operates in such a direction as to prevent the voltage change of the next captured input data toward "H" or "L" (kickback), which deteriorates the accuracy of the voltage comparator.

For example, as shown in FIG. 49, if the latch output LOUT at "H" is outputted in the AZ period of the period T23, the output VOUT of the inverter INV3 may not be lowered enough in the COMP period in the following period T24, possibly causing the latch output LOUT to erroneously output "H" in the AZ period in the period T24.

SUMMARY OF THE INVENTION

According to a first aspect of the present invention, a voltage comparator comprises: a first capacitor having a first electrode receiving a first voltage in a first period and receiving a second voltage in a second period; a first inverting amplifier having its input portion connected to a second electrode of the first capacitor and attaining a good gain characteristic when the input portion is set to a first bias voltage, for inversely amplifying a signal received at the input portion in the second period to output a first amplification signal; an output-providing inverting amplifier for amplifying a signal related to the first amplification signal to output an amplification output signal; and bias voltage assisting means provided separately from the first inverting amplifier, for providing an auxiliary voltage at the same level as the first bias voltage to the input portion of the first inverting amplifier in the first period.

Preferably, according to a second aspect, in the voltage comparator, the first inverting amplifier is shorted between its input and output and its input portion is set to the first bias voltage in the first period, and the bias voltage assisting means includes an auxiliary inverting amplifier connected in parallel to the first inverting amplifier and having the same input/output characteristic as the first inverting amplifier, wherein the auxiliary inverting amplifier is shorted between its input and output and its input portion is set to the auxiliary voltage in the first period.

Preferably, according to a third aspect, in the voltage comparator, the output-providing inverting amplifier has its input portion connected to the output portion of the first inverting amplifier and the signal related to the first amplification signal includes the first amplification signal itself, wherein the first inverting amplifier, the auxiliary inverting amplifier and the output-providing inverting amplifier have the same input/output characteristic.

Preferably, according to a fourth aspect, the voltage comparator further comprises a second capacitor having its first electrode connected to the output portion of the first inverting amplifier, and a second inverting amplifier having its input portion connected to a second electrode of the second capacitor and its output portion connected to the input portion of the output-providing inverting amplifier, wherein the input and output portions of the second inverting amplifier are shorted and the input portion is set to a second bias voltage in the first period, and the second inverting amplifier amplifies a signal obtained from the input portion in the second period to output a second amplification signal, and wherein the signal related to the first amplification signal includes the second amplification signal.

Preferably, according to a fifth aspect, in the voltage comparator, the bias voltage assisting means includes bias voltage supply means for supplying the first bias voltage to the input portion of the first inverting amplifier in the first period.

Preferably, according to a sixth aspect, in the voltage comparator, the input portion of the first inverting amplifier includes first and second differential input portions, its output portion includes first and second differential output portions, and the first amplification signal includes first and second differential amplification signals that are in opposite phases to each other, wherein the first inverting amplifier amplifies a potential difference between signals obtained from the first and second differential input portions to output the first and second differential amplification signals from the first and second differential output portions, respectively. The first capacitor includes first and second differential capacitors, one of the first and second differential capacitors receiving at its first electrode the first voltage in the first period and the second voltage in the second period, wherein the first differential input portion of the first inverting amplifier is connected to a second electrode of the first differential capacitor and the second differential input portion of the first inverting amplifier is connected to a second electrode of the second differential capacitor.

According to a seventh aspect of the present invention, a voltage comparator for voltage-comparing first and second voltages to output the result of the voltage comparison comprises: a first capacitor having first and second electrodes, one of which is an impurity semiconductor electrode and the other of which is a polysilicon or metal electrode, the first electrode of the first capacitor receiving a first related voltage in a first period and receiving a second related voltage in a second period; a first inverting amplifier having an input portion connected to the second electrode of the first capacitor, the input portion of the first inverting amplifier being set to a first bias voltage attaining a good gain characteristic in the first period, the first inverting amplifier inversely amplifying a signal received from the input portion in the second period to output a first amplification signal; an output-providing inverting amplifier for amplifying a signal related to the first amplification signal to output an amplification output signal as the voltage comparison result; and first capacitor voltage control means provided on the side of the first or second electrode of the first capacitor, for voltage-controlling the first or second electrode side of the first capacitor so that the first capacitor operates in an operating region where its capacitance value has small voltage dependence.

Preferably, according to an eighth aspect, in the voltage comparator, the first capacitor voltage control means includes first level converting means receiving the first and second voltages for converting the first and second voltages to provide the first and second related voltages to the first electrode of the first capacitor, respectively, wherein the first and second related voltages are at a level so that the first capacitor operates in an operating region in which its capacitance value has small voltage dependence when the voltage at the second electrode of the first capacitor is at the first bias voltage.

Preferably, according to a ninth aspect, in the voltage comparator, the first capacitor voltage control means including capacitor bias voltage supply means for supplying a capacitor bias voltage to the second electrode of the first capacitor in the first period, the capacitor bias voltage being at a level so that the first capacitor operates in an operating region in which its capacitance value has small voltage dependence when the first electrode of the first capacitor is at the first or second related voltage, and first level converting means for level-converting a voltage obtained from the second electrode of the first capacitor and providing the converted voltage to the input portion of the first inverting amplifier, wherein the first level converting means level-converts the capacitor bias voltage to the first bias voltage in the first period.

Preferably, according to a tenth aspect, in the voltage comparator, the capacitor bias voltage supply means including first comparison voltage generating means for generating a fixed first comparison voltage, second level converting means for level-converting the capacitor bias voltage to provide a second comparison voltage, and voltage comparing means for comparing the first and second comparison voltages to output the capacitor bias voltage on the basis of a result of the comparison, wherein the first comparison voltage is equal to the first bias voltage and the second level converting means has the same converting characteristic as the first level converting means.

Preferably, according to an eleventh aspect, in the voltage comparator, the input portion of the first inverting amplifier includes first and second differential input portions, its output portion includes first and second differential output portions, and the first amplification signal includes first and second differential amplification signals that are in opposite phases to each other, wherein the first inverting amplifier amplifies a potential difference between signals obtained from the first and second differential input portions to output the first and second differential amplification signals from the first and second differential output portions, respectively. The first capacitor includes first and second differential capacitors, one of the first and second differential capacitors receiving at its first electrode the first related voltage in the first period and the second related voltage in the second period, wherein the first differential input portion of the first inverting amplifier is connected to a second electrode of the first differential capacitor and the second differential input portion of the first inverting amplifier is connected to a second electrode of the second differential capacitor.

Preferably, according to a twelfth aspect, the voltage comparator further comprises a second capacitor having first and second electrodes, one of which is an impurity semiconductor electrode and the other is a polysilicon or metal electrode, the first electrode being disposed on the side of an output portion of the first inverting amplifier, a second inverting amplifier having its input portion connected to the second electrode of the second capacitor and its output portion connected to an input portion of the output-providing inverting amplifier, the input portion of the second inverting amplifier being set to a second bias voltage attaining a good gain characteristic in the first period, the second inverting amplifier inversely amplifying a signal received at the input portion in the second period to output a second amplification signal, the signal related to the first amplification signal including the second amplification signal, and second capacitor voltage control means provided on the side of the first or second electrode of the second capacitor, for voltage-controlling the first or second electrode of the second capacitor so that the second capacitor operates in an operating region in which its capacitance value has small voltage dependence.

Preferably, according to a thirteenth aspect, in the voltage comparator, the second capacitor voltage control means includes first level converting means for level-converting the first amplification signal to provide a first level conversion voltage to the first electrode of the second capacitor, wherein the first level conversion voltage is at a level so that the second capacitor operates in an operating region in which its capacitance value has small voltage dependence when the voltage at the second electrode of the second capacitor is at the second bias voltage.

Preferably, according to a fourteenth aspect, in the voltage comparator, the first bias voltage of the first inverting amplifier is at a level so that the first capacitor operates in an operating region in which its capacitance value has small voltage dependence when the first electrode of the first capacitor is at the first or second related voltage, and the second bias voltage of the second inverting amplifier is at a level so that the second capacitor operates in an operating region in which its capacitance value has small voltage dependence when the first electrode of the second capacitor is at the second bias voltage, and wherein the first inverting amplifier includes the first capacitor voltage control means provided on the side of the second electrode of the first capacitor, and the second inverting amplifier includes the second capacitor voltage control means provided on the side of the second electrode of the second capacitor.

Preferably, according to a fifteenth aspect, in the voltage comparator, the first inverting amplifier includes an amplification portion for inversely amplifying a signal received from its input portion in the second period to output an internal amplification signal, and a level converting portion for level-coverting the internal amplification signal to output the first amplification signal, wherein the first amplification signal is at a level so that the second capacitor operates in an operating region in which its capacitance value has small voltage dependence when the second electrode of the second capacitor is at the second bias voltage, and wherein the second capacitor voltage control means is provided on the side of the first electrode of the second capacitor and shares the level converting portion.

According to a sixteenth aspect, a voltage comparator comprises: a first capacitor having a first electrode receiving a first voltage in a first period and receiving a second voltage in a second period; a first inverting amplifier having its input portion connected to the side of a second electrode of the first capacitor, the input portion of the first inverting amplifier being set to a first bias voltage attaining a good gain characteristic in the first period, the first inverting amplifier inversely amplifying a signal received from the input portion in the second period to output a first amplification signal; an output-providing inverting amplifier for amplifying a signal related to the first amplification signal to output an amplification output signal; and latch means having an input portion and an output portion, receiving the amplification output signal at the input portion as latch data in the second period, and feeding back a signal obtained from the output portion to the input portion without receiving the amplification output signal at the input portion and holding the latch data in the first period; wherein the output-providing inverting amplifier has a driving capability set to such a level as not to be affected by the capacitance attendant on the input portion of the latch means.

Preferably, according to a seventeenth aspect, the voltage comparator further comprises a second capacitor having its first electrode connected to an output portion of the first inverting amplifier, and a second inverting amplifier having its input portion connected to a second electrode of the second capacitor and its output portion connected to an input portion of the output-providing inverting amplifier, wherein the input portion of the second inverting amplifier is set to a second bias voltage in the first period and the second inverting amplifier amplifiers a signal obtained from the input portion in the second period to output a second amplification signal, wherein the latch means includes first and second partial inverting amplifiers connected in series from the input portion to the output portion, the second inverting amplifier includes third and fourth partial inverting amplifiers connected in parallel between the input and output portions, and the output-providing inverting amplifier includes fifth and sixth partial inverting amplifiers connected in parallel between the input and output portions, and wherein the first to sixth partial inverting amplifiers have input/output characteristics set equal.

According to an eighteenth aspect, an A/D converter comprises the voltage comparator of the first aspect, the seventh aspect, or the sixteenth aspect, the voltage comparator includes a plurality of voltage comparators; input voltage providing means for providing an analog input voltage to the plurality of voltage comparators in common as the first voltage; reference voltage providing means for providing a plurality of different reference voltages to the plurality of voltage comparators, respectively, as the second voltage; and encode means for encoding signals related to the amplification output signal from the plurality of voltage comparators to output a digital signal.

As have been described so far, the bias voltage assisting means of the voltage comparator of the first aspect of this invention provides the input portion of the first inverting amplifier with an auxiliary voltage at the same level as the first bias voltage in the first period. Accordingly, even if the frequency of the input signal (the first or second voltage) becomes high in the first period, the input portion of the first inverting amplifier varies only slightly from the first bias voltage and the offset voltage seen from the input side is small enough. This enables highly accurate comparing operation.

The bias voltage assisting means of the voltage comparator of the second aspect includes an auxiliary inverting amplifier connected in parallel to the first inverting amplifier and having the same input/output characteristic as the first inverting amplifier. The input and output of the auxiliary inverting amplifier are shorted in the first period and the input portion is set to the auxiliary voltage.

Thus, in the first period, the voltage at the input portion of the first inverting amplifier is set to the first bias voltage (the auxiliary voltage) by shorting the input and output of the auxiliary inverting amplifier, in addition to shorting the input and output of the first inverting amplifier.

As a result, the input portion of the first inverting amplifier is set to the first bias voltage with a driving capability of the first inverting amplifier plus that of the auxiliary inverting amplifier. Then even if the frequency of the input signal becomes high in the first period, the offset voltage seen from the input side can be made small enough.

In the voltage comparator of the third aspect, the first inverting amplifier, the auxiliary inverting amplifier and the output-providing inverting amplifier have the same input/output characteristic. Accordingly, even if the output portion of the first inverting amplifier (and the auxiliary inverting amplifier) and the input portion of the output-providing inverting amplifier are directly connected, no such off set voltage is caused as may be caused by a difference in input/output characteristic between the two.

In the voltage comparator of the fourth aspect, the output portion of the first inverting amplifier (and the auxiliary inverting amplifier) is connected to the input portion of the second inverting amplifier through the second capacitor. Accordingly, even if a gap exists between the input/output characteristic of the first inverting amplifier and that of the second inverting amplifier, almost no offset voltage is caused in the first inverting amplifier.

The bias voltage assisting means of the voltage comparator of the fifth aspect includes bias voltage supply means for supplying the first bias voltage to the input portion of the first inverting amplifier in the first period. Accordingly, it is possible to set the input portion of the first inverting amplifier to the first bias voltage without shorting the input and output of the first inverting amplifier. Then, even if the frequency of the input signal becomes high in the first period, the offset voltage seen from the input side can be made small enough.

The first inverting amplifier of the sixth aspect amplifies a potential difference between signals obtained from first and second differential input portions to output first and second differential amplification signals from first and second differential output portions, respectively. Accordingly, providing opposite-phase input signals to the first and second differential input portions through first and second differential capacitors provides accurate comparison between the first voltage and the second voltage.

The first capacitor voltage control means of the voltage comparator of the seventh aspect of the present invention is provided on the first or second electrode side of the first capacitor to voltage control the first or second electrode side of the first capacitor so that the first capacitor operates in an operating region in which its capacitance value has small voltage dependence. Accordingly, even if a first capacitor whose capacitance value is liable to change depending on the voltage conditions at the first and second electrodes is used, the comparing operation can be accurately performed.

The first capacitor voltage control means of the voltage comparator of the eighth aspect includes first level converting means which converts the first and second voltages to provide first and second related voltages to the first electrode of the first capacitor.

The first and second related voltages are at a level so that the first capacitor operates in an operating region in which its capacitance value has small voltage dependence when the voltage at the second electrode of the first capacitor is at the first bias voltage. Accordingly, even if a first capacitor whose capacitance value is prone to change depending on voltage conditions at the first and second electrodes is used, the comparing operation can be made accurately.

In the voltage comparator of the ninth aspect, the first capacitor voltage control means includes capacitor bias voltage supply means for providing a capacitor bias voltage to the second electrode of the first capacitor in the first period and the capacitor bias voltage is at a level so that the first capacitor operates in an operating region in which its capacitance value has small voltage dependence when the first electrode of the first capacitor is at the first or second related voltage. Accordingly, even if the first capacitor has a capacitance value liable to change depending on voltage conditions at the first and second electrodes, the comparison operation can be performed accurately.

The first capacitor voltage control means further includes first level converting means for level converting the voltage obtained from the second electrode of the first capacitor and providing it to the input portion of the first inverting amplifier, which level converts the capacitor bias voltage to the first bias voltage in the first period. Accordingly, no adverse influence is exerted on the operation of the first inverting amplifier.

In the voltage comparator of the tenth aspect, the capacitor bias voltage supply means includes first comparison voltage generating means for generating a fixed first comparison voltage, second level converting means for level converting the capacitor bias voltage to provide a second comparison voltage, and voltage comparing means for comparing the first and second comparison voltages to output a capacitor voltage on the basis of the comparison result. The first comparison voltage is equal to the first bias voltage and the second level converting means has the same converting characteristic as the first level converting means.

Accordingly, the capacitor bias voltage supply means can supply a capacitor bias voltage which the first level converting means can correctly level-convert to the first bias voltage in the first period.

The first inverting amplifier of the eleventh aspect amplifies a potential difference between signals obtained from first and second differential input portions and outputs first and second differential amplification signals from the first and second differential output portions, respectively. Hence, providing input signals in opposite phases to the first and second differential input portions through first and second differential capacitors provides accurate comparison between the first related voltage and the second related voltage.

The first capacitor voltage control means of the voltage comparator of the twelfth aspect is provided on the first or second electrode side of the second capacitor and voltage controls the first or second electrode side of the second capacitor so that the second capacitor operates in an operating region in which its capacitance value has small voltage dependence. Hence, even if the second capacitor, as well as the first capacitor, has capacitance value prone to change depending on voltage conditions at the first and second electrodes, the comparing operation can be accurately performed.

The second capacitor voltage control means of the voltage comparator of the thirteenth aspect includes first level converting means for level converting the first amplification signal and providing a first level conversion voltage to the first electrode of the second capacitor.

The first level conversion voltage is at a level so that the second capacitor operates in an operating region of the second capacitor in which its capacitance value has small voltage dependence when the voltage at the second electrode of the second capacitor is at the second bias voltage. Accordingly, the comparing operation can be accurately performed even if the second capacitor has capacitance value liable to change depending on voltage conditions at the first and second electrodes.

In the voltage comparator of the fourteenth aspect, the first bias voltage for the first inverting amplifier is at such a level that the first capacitor operates in an operating region in which its capacitance value has small voltage dependence when the first electrode of the first capacitor is at the first or second related voltage. The second bias voltage for the second inverting amplifier is at such a level that the second capacitor operates in an operating region in which its capacitance value has small voltage dependence when the first electrode of the second capacitor is at the second bias voltage.

Accordingly, the comparison operation can be accurately performed by using first and second inverting amplifiers having input/output characteristics fitted to the first and second capacitors whose capacitance values are liable to change depending on voltage conditions at the first and second electrodes.

In the voltage comparator of the fifteenth aspect, the first inverting amplifier includes a level converting portion for level converting an internal amplification signal to output the first amplification signal and the first amplification signal is at a level so that the second capacitor operates in an operating region in which its capacitance value has small voltage dependence when the second electrode of the second capacitor is at the second bias voltage.

Accordingly, the comparing operation can be accurately per formed by using a first inverting amplifier outputting the first amplification signal fitted to the second capacitor whose capacitance value is prone to change depending on voltage conditions at the first and second electrodes.

In the sixteenth aspect, the driving capability of the output-providing inverting amplifier for outputting the amplification output signal to the latch means of the voltage comparator is set to such a level as not to be affected by the capacitance appendant to the input portion of the latch means. Accordingly, the previous data latched in the latch means does not prevent voltage change of the input data captured next, certainly preventing malfunction.

In the voltage comparator of the seventeenth aspect, since the output-providing inverting amplifier includes fifth and sixth partial inverting amplifiers connected in parallel between the input and output, the amplification output signal can be outputted with a relatively large driving capability.

The first to sixth partial inverting amplifiers in the second inverting amplifier, the output-providing inverting amplifier and the latch circuit have equally set input/out put characteristics. Accordingly, no malfunction is caused even if the second inverting amplifier and the output-providing inverting amplifier are each formed as a parallel connection of two partial inverting amplifiers.

The A/D converter of the eighteenth aspect is formed by using the voltage comparator of the first, seventh, or sixteenth aspect. Each of the plurality of voltage comparators can thus accurately make voltage comparison between the input voltage and the reference voltage, resulting in high-accuracy A/D converter.

The present invention has been made to solve the above-described problems (1) to (3). It is an object of the present invention to obtain a voltage comparator and an A/D converter which are capable of highly accurate voltage comparison realizing any of the following points (1) to (3).

(1) Offset voltage can be prevented without increasing the power consumption even if the input signal frequency becomes high.

(2) Highly accurate voltage comparison can be performed even when a capacitor having voltage dependence is used.

(3) Highly accurate voltage comparison can be performed with reduced kickback from the latch circuit.

These and other objects, features, aspects and advantages of the present invention will become more apparent from the following detailed description of the present invention when taken in conjunction with the accompanying drawings.

DESCRIPTION OF THE PREFERRED EMBODIMENTS

<<First Preferred Embodiment>>

FIRST EXAMPLE

Figure 1:
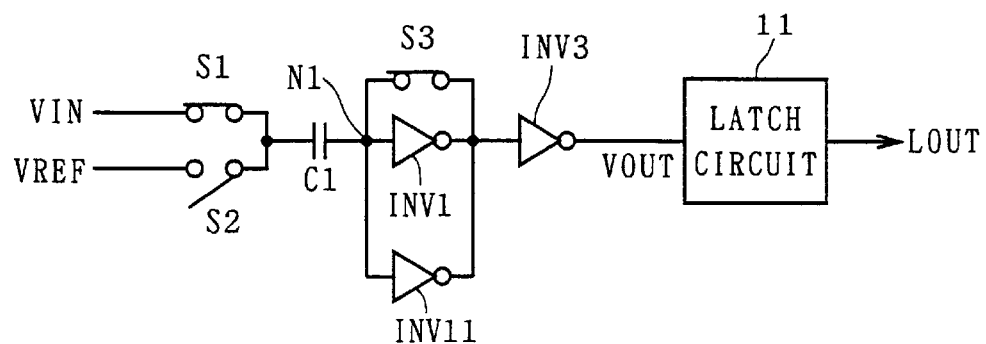
FIG. 1 is a circuit diagram showing a configuration of a first example of a chopper type voltage comparator according to a first preferred embodiment of the present invention.

FIG. 1 is a circuit diagram showing a configuration of a first example of a chopper type voltage comparator according to a first preferred embodiment of the present invention. As shown in this diagram, the input voltage VIN and the reference voltage VREF are connected to one electrode of the capacitor C1 through the switches S1 and S2, respectively. The other electrode of the capacitor C1 is connected to the input portion of the inverter (amplifier) INV1. The output portion of the inverter INV1 (which outputs a first amplification signal) is connected to the input portion of the inverter (amplifier) INV3 and is also fed back to the input through the switch S3. The output VOUT (which outputs an amplification signal for output) of the inverter INV3 is provided to the latch circuit 11 and the latch output LOUT outputted from the latch circuit 11 makes the output of the voltage comparator.

An inverter (amplifier) INV11 is connected in parallel with the inverter INV1. Accordingly, the input of the inverter INV11 is connected to the other electrode of the capacitor C1, and its output is connected to the input portion of the inverter INV3 and is also fed back to the input through the switch S3.

Figure 31:
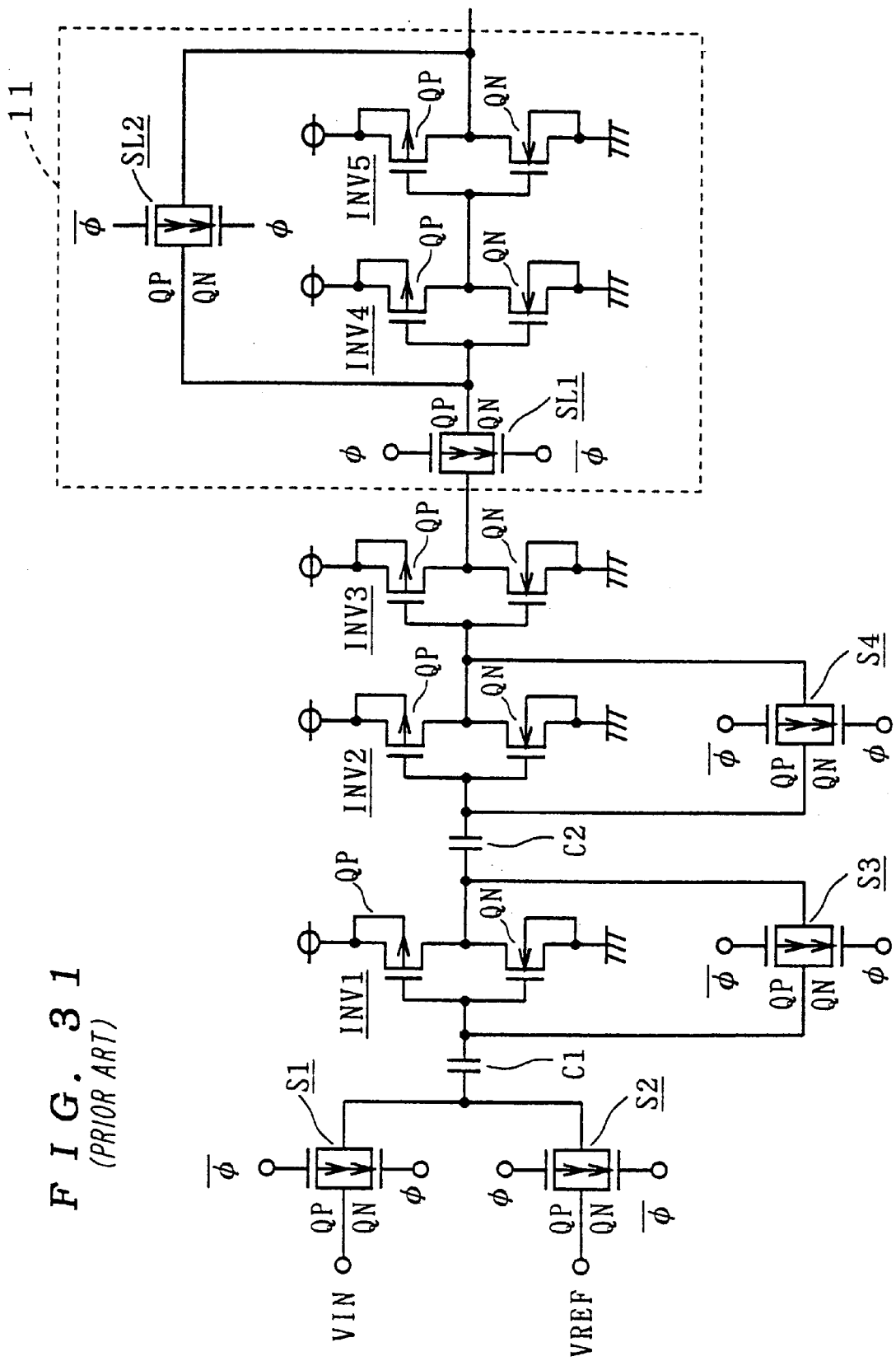
FIG. 31 is a circuit diagram fully showing the inside of the chopper type voltage comparator of FIG. 30.
Figure 32:
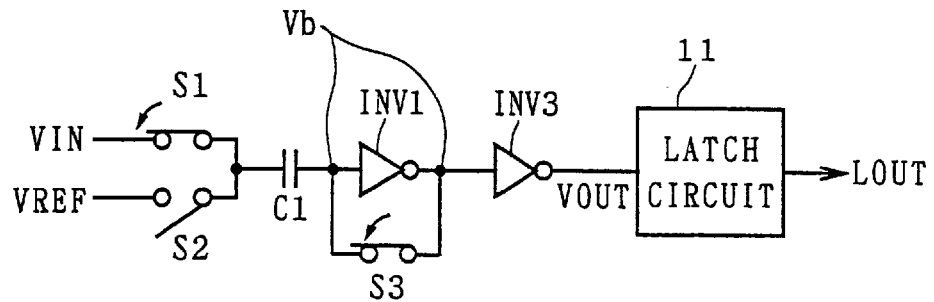
FIG. 32 is a circuit diagram showing the condition of the chopper type voltage comparator in an auto-zero period.
Figure 33:
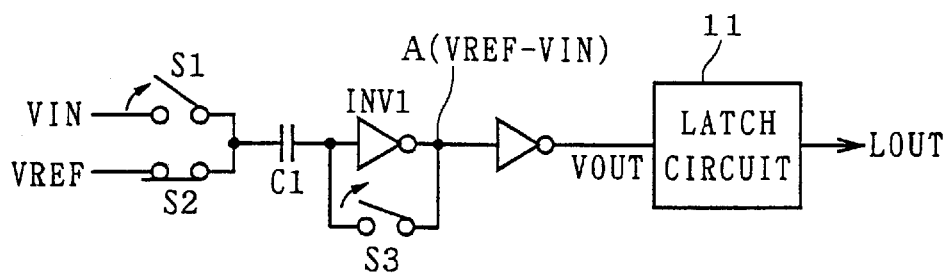
FIG. 33 is a circuit diagram showing the condition of the chopper type voltage comparator in a comparison period.
Figure 34:
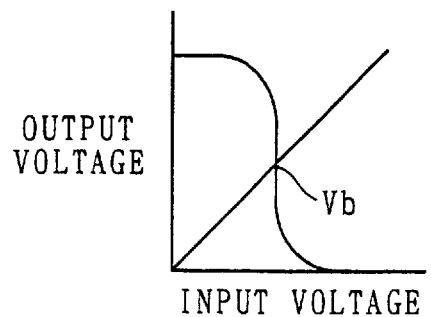
FIG. 34 is a graph showing the operation of the chopper type voltage comparator in the auto-zero period.
Figure 35:
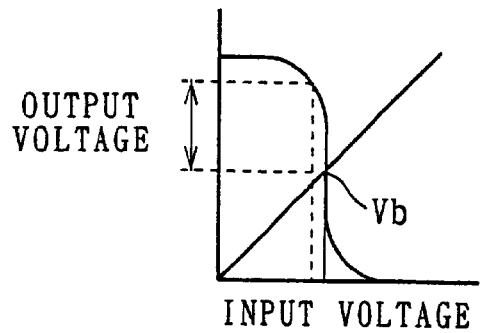
FIG. 35 is a graph showing the operation of the chopper type voltage comparator in the comparison period.
Figure 36:
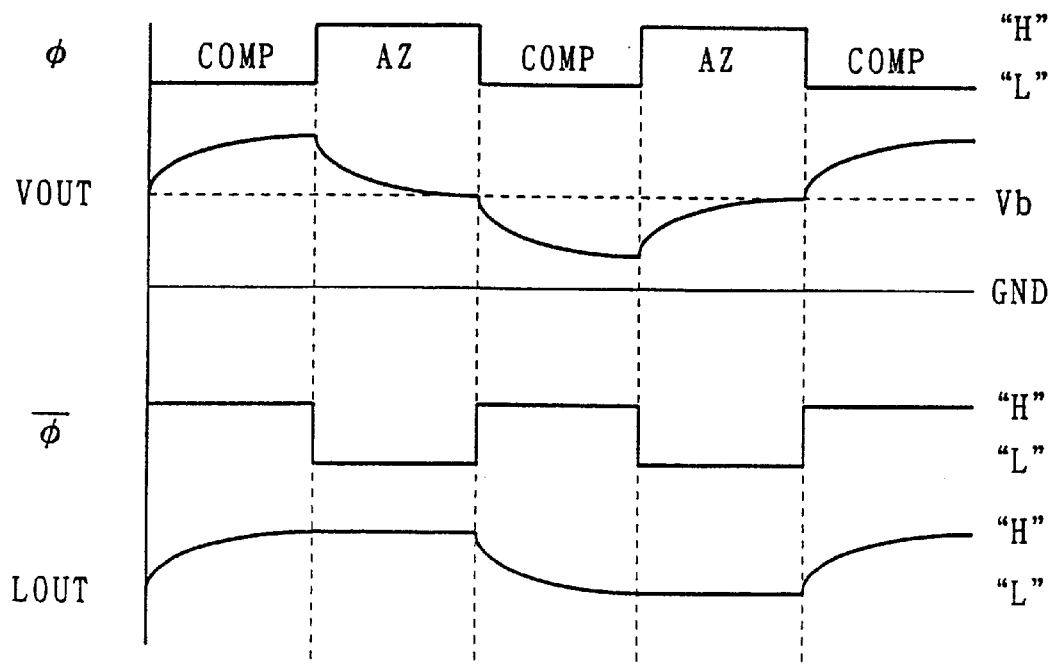
FIG. 36 is a timing diagram showing the entire operation of the conventional chopper type voltage comparator.
Figure 37:
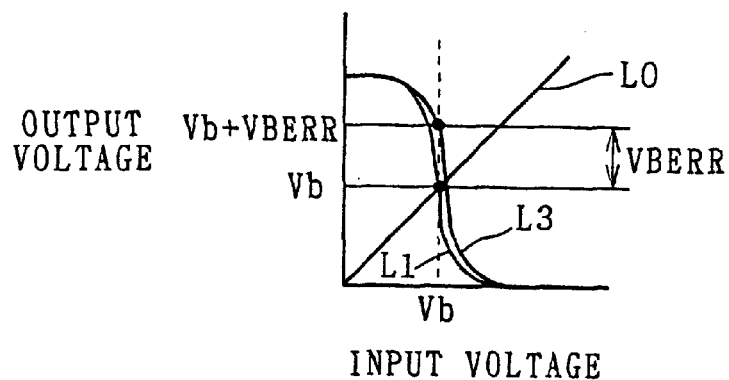
FIG. 37 is a graph showing a problem caused when there is a difference in input/output characteristic between continuous inverter amplifiers.
Figure 38:
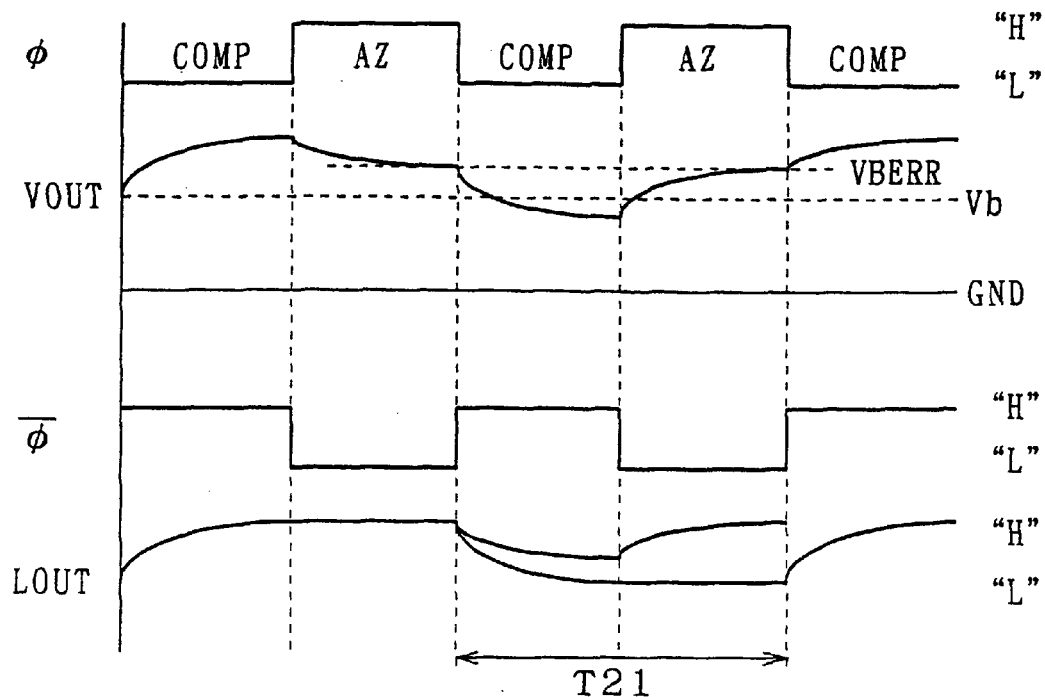
FIG. 38 is a timing diagram showing the problem caused when there is a difference in input/output characteristic between continuous inverter amplifiers.
Figure 39:
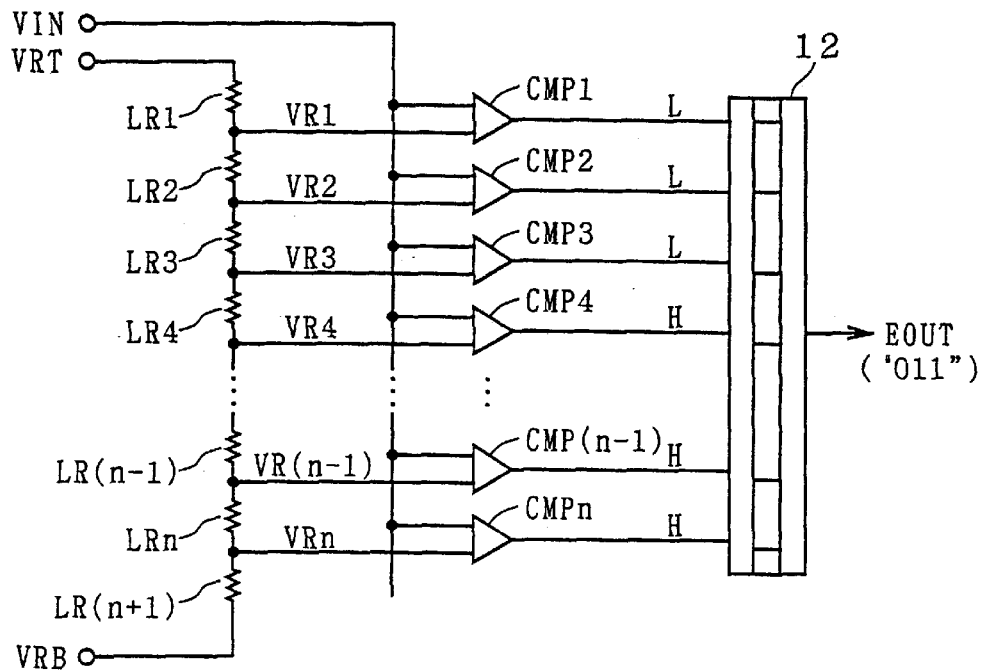
FIG. 39 is a circuit diagram showing a configuration of a conventional parallel type A/D converter.
Figure 40:
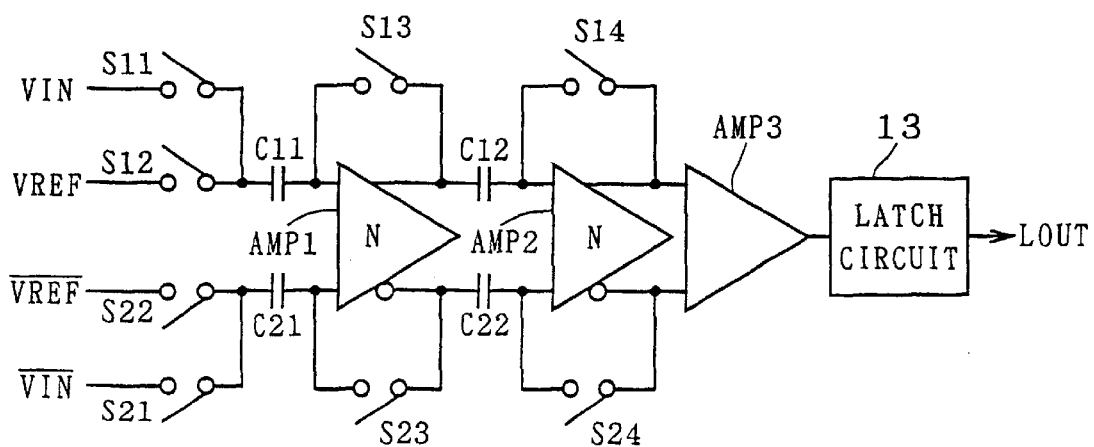
FIG. 40 is a circuit diagram showing a configuration of a conventional chopper type voltage comparator using differential amplifiers.

The inverters INV1, INV3 and INV11, serving as inverting amplifiers, and the switches S1–S3 have the same internal configurations as the inverters (INV1 etc.) and the switches (S1 etc.) shown in FIG. 31. The switch S1 is driven between on and off in the opposite phase to the switch S2, and the switch S1 and the switch S3 are on/off driven in the same phase.

At this time, the input/output characteristics of the inverter INV1, the inverter INV3 and the inverter INV11 are set equal. That is to say, they are set equal in size, configuration on the layout pattern, and orientation.

With this configuration, the inverter amplifiers in the first stage, or the inverter INV1 and the inverter INV11 connected in parallel, provide larger driving capability and smaller output resistance. Accordingly, even if the input signal frequency of the input voltage VIN becomes high, the voltage VN1 at the input portion of the inverters INV1 and INV11 in the AZ period (the switch S3 is in an on state) makes smaller changes and is stabilized around the bias voltage Vb. Accordingly, the offset voltage seen from the input side is small enough even if the input signal frequency becomes high, thus providing highly accurate voltage comparison. When an A/D converter is formed by using the voltage comparator of the first example of the first preferred embodiment, the A/D converter provides high accuracy.

Furthermore, it is not necessary to use a larger inverter INV3 in the next stage so that it agrees with the characteristics of the inverter amplifiers INV1 and INV11 in the first stage. That is to say, since the input/output characteristics of the unit inverter amplifiers (INV1, INV3 and INV11) agree, it is not necessary to connect the same number of inverter amplifiers in parallel in the next stage as the number of the inverter amplifiers connected in parallel in the first stage. This minimizes the number of required additional inverter amplifiers, which suppresses the increase in power consumption.

SECOND EXAMPLE

Figure 2:
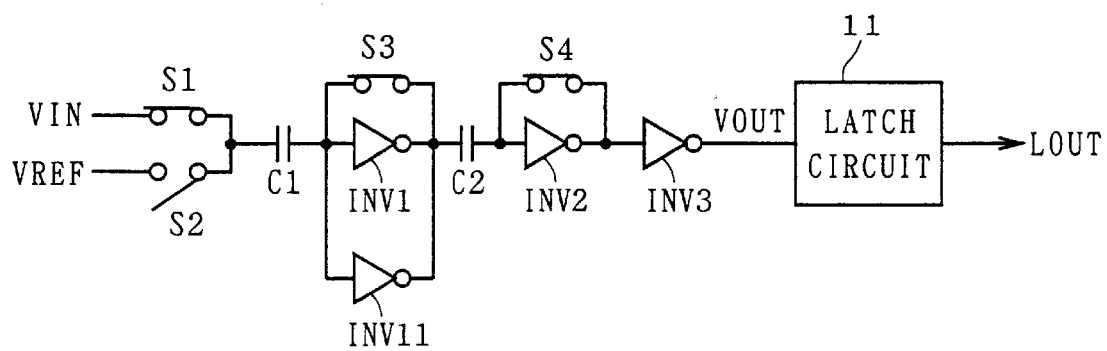
FIG. 2 is a circuit diagram showing a configuration of a second example of the chopper type voltage comparator according to the first preferred embodiment of the present invention.

FIG. 2 is a circuit diagram showing a configuration of a second example of the chopper type voltage comparator according to the first preferred embodiment of the present invention. As shown in this diagram, the input voltage VIN and the reference voltage VREF are connected to one electrode of the capacitor C1 through the switches S1 and S2, respectively. The other electrode of the capacitor C1 is connected to the input portion of the inverter INV1. The output portion (which outputs a first amplification signal) of the inverter INV1 is connected to the one electrode of the capacitor C2 and is also fed back to the input through the switch S3. The other electrode of the capacitor C2 is connected to the input portion of the inverter (amplifier) INV2. The output portion (which outputs a second amplification signal) of the inverter INV2 is connected to the input portion of the inverter INV3 and is also fed back to the input through the switch S4. The output VOUT (an amplification signal for output) from the inverter INV3 is provided to the latch circuit 11 and the latch output LOUT outputted from the latch circuit 11 serves as an output of the voltage comparator.

In the second example, similarly to the first example, the inverter INV11 is connected in parallel to the inverter INV1. Accordingly, the input of the inverter INV11 is connected to the other electrode of the capacitor C1 and the output portion is connected to the one electrode of the capacitor C2 and is also fed back to the input through the switch S3.

The inverters INV1–INV3 and INV11, serving as inverting amplifiers, and the switches S1–S4 have the same internal configurations as the inverters (INV1 etc.) and the switches (S1 etc.) shown in FIG. 31. The switch S1 is on/off driven in the opposite phase to the switch S2, and the switch S1, the switch S3 and the switch S4 are on/off driven in the same phase.

At this time, the input/output characteristics of the inverter INV1 and the inverter INV11 are set equal.

With this configuration, similarly to the first example, the output resistance of the inverter amplifiers in the first stage is small since the inverter INV1 and the inverter INV11 are connected in parallel. Hence, the change of the voltage VN1 at the input portion of the inverters INV1 and INV11 in the AZ period is small and is stabilized around the bias voltage Vb even if the input signal frequency of the input voltage VIN becomes high. Accordingly, the offset voltage seen from the input side can be small enough even if the input signal frequency becomes high, thus providing highly accurate comparison results. When an A/D converter is formed by using the voltage comparator of the second example of the first preferred embodiment, the A/D converter provides high accuracy.

Furthermore, the inverter INV2 is connected to the inverter amplifier INV1 through the capacitor C2. Hence, even if the input/output characteristic of the inverter INV2 does not correctly coincide with that of the inverter INV1 (the inverter INV11), the difference in input/output characteristic between the inverter INV1 and the inverter INV2 hardly causes offset voltage in the inverter INV1. For the purpose of speeding up, the driving capability of the inverter INV2 can be increased.

In the first example, when the voltage VN1 at the input portion of the inverter amplifiers INV1 and INV11 in the first stage can not be fixed at the bias voltage Vb in the AZ period, the variation is, though attenuated, transmitted to the input portion of the inverter amplifier INV3 in the next stage. In the second example, however, the inverter amplifier INV2 in the next stage is not affected by the variation at the input portion (output portion) of the inverter amplifiers in the first stage, for it is connected through the capacitor C2.

<<Second Preferred Embodiment>>

Figure 3:
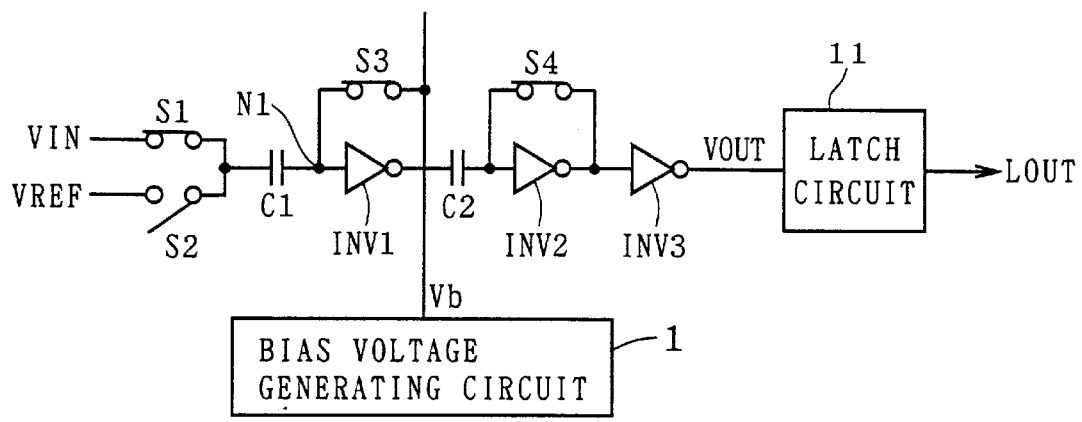
FIG. 3 is a circuit diagram showing a configuration of a chopper type voltage comparator according to a second preferred embodiment of the present invention.

FIG. 3 is a circuit diagram showing a configuration of a chopper type voltage comparator according to a second preferred embodiment of the present invention. As shown in this diagram, the input voltage VIN and the reference voltage VREF are connected to one electrode of the capacitor C1 through the switches S1 and S2, respectively. The other electrode of the capacitor C1 is connected to the input portion of the inverter INV1 and the output portion of the inverter INV1 is connected only to one electrode of the capacitor C2.

The output portion of a bias voltage generating circuit 1 is connected to the input portion of the inverter INV1 through the switch S3. The bias voltage generating circuit 1 generates a bias voltage Vb from the low-impedance output portion. In other respects, the configuration is the same as that of the second example of the first preferred embodiment shown in FIG. 2.

The switch S1 is on/off driven in the opposite phase to the switch S2, and the switch S1, the switch S3 and the switch S4 are on/off driven in the same phase.

In this configuration, even if the input signal frequency of the input voltage VIN becomes high, the voltage VN1 at the input portion of the inverter INV1 in the AZ period (the switch S3 is in an on state) is set to the bias voltage Vb by the bias voltage generating circuit 1 and is stabilized around the bias voltage Vb without the necessity of shorting the input and output of the inverter INV1. Accordingly, even if the input signal frequency becomes high, the offset voltage seen from the input side can be made small enough, providing highly accurate voltage comparison. As a result, when an A/D converter is formed by using the voltage comparator of the second preferred embodiment, the A/D converter provides high accuracy.

At this time, since the driving capability of the inverter INV1 itself is not enlarged, an increase in power consumption can be suppressed.

In the second preferred embodiment, the inverter amplifier INV2 is further provided through the capacitor C2. Accordingly, even if the input/output characteristic of the first stage inverter INV1 does not agree with the bias voltage Vb due to variations among elements, the offset voltage caused by the variations in the inverter INV1 is eliminated in the capacitor C2 as long as the inverter INV2 itself is biased at a relatively high gain, not to deteriorate the accuracy of the voltage comparator.

When forming a parallel type A/D converter by using a plurality of chopper type voltage comparators of the second preferred embodiment, the bias voltage generating circuit 1 can be shared among a plurality of voltage comparators for effective utilization.

<Bias Voltage Generating Circuit>

Figure 4:
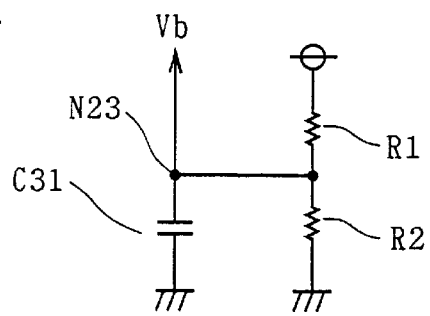
FIG. 4 is a circuit diagram showing a configuration of the bias voltage generating circuit of FIG. 3.

FIG. 4 is a circuit diagram showing an example of a configuration of the bias voltage generating circuit. As shown in this diagram, resistors R1 and R2 are connected in series between a power supply VDD and ground and the node N23 between the resistors R1 and R2 is grounded through a capacitor C31, where the signal obtained from the node N23 makes the bias voltage Vb. The bias voltage Vb is about VDD/2 due to resistance division of the resistors R1 and R2. The capacitor C31 is provided to reduce impedance for high-frequency input.

Figure 5:
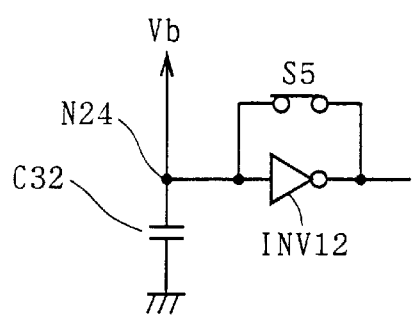
FIG. 5 is a circuit diagram showing a configuration of the bias voltage generating circuit of FIG. 3.

FIG. 5 is a circuit diagram showing another example of a configuration of the bias voltage generating circuit. As shown in this diagram, the input and output of an inverter (amplifier) INV12 are connected through a switch S5 and the node N24 corresponding to the input portion of the inverter INV12 is grounded through a capacitor C32, where the signal obtained from the node N24 makes the bias voltage Vb. This inverter INV12 has the same input/output characteristic as the inverter INV2 and the switch S5 is driven in the same phase as the switches S1, S3 and S4.

In this configuration, when the switch S5 turns on in the AZ period, the inverter INV12 is shorted between its input and output and the bias voltage Vb is outputted from the node N24. The capacitor C32 is provided for impedance reduction for high-frequency input.

<Operation>

Figure 6:
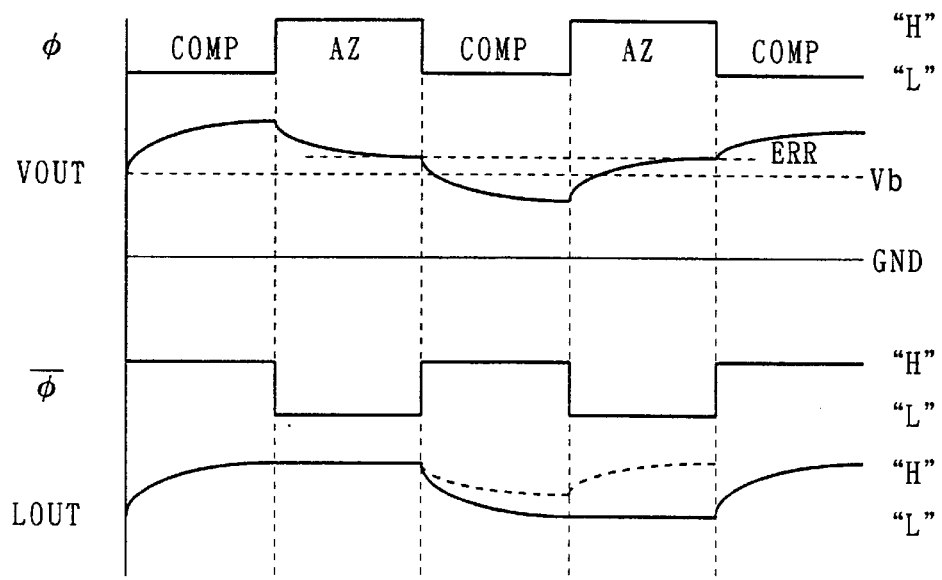
FIG. 6 is a timing diagram showing the operation of the second preferred embodiment.

FIG. 6 is a timing diagram showing the operation of the chopper type voltage comparator of the second preferred embodiment. As shown in this diagram, the output VOUT of the inverter INV3 somewhat varies from the bias voltage Vb in the AZ period. However, since the amount of change ERR can be suppressed sufficiently small, the latch output LOUT does not provide a wrong value as shown by the dotted line. This means that the chopper type voltage comparator of the second preferred embodiment can normally operate with a higher conversion rate.

<Others>

It is also possible to use a configuration using the bias voltage generating circuit 1 of the second preferred embodiment in place of the inverter INV11 of the first example of the first preferred embodiment. In this case, similarly to the configuration shown in FIG. 3, although some offset voltage occurs, it is possible to stabilize the input portion of the inverter INV1 around the bias voltage Vb even if the input signal frequency of the input voltage VIN becomes high.

<<Third Preferred Embodiment>>

Figure 7:
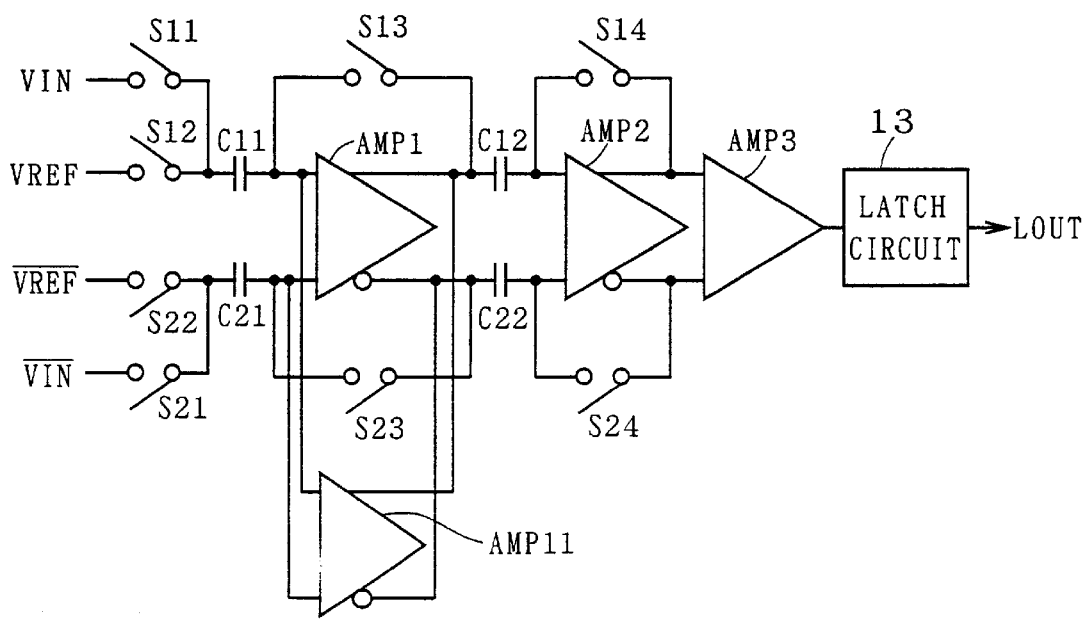
FIG. 7 is a circuit diagram showing a configuration of a chopper type voltage comparator according to a third preferred embodiment of the present invention.

FIG. 7 is a circuit diagram showing a configuration of a chopper type voltage comparator according to a third preferred embodiment of the present invention. As shown in this diagram, the input voltage VIN and the reference voltage VREF are connected to one electrode of a capacitor C11 through switches S11 and S12, respectively. The other electrode of the capacitor C11 is connected to a first input portion of a differential amplifier AMP1, whose first output portion is connected to one electrode of a capacitor C12 and is also fed back to the first input through a switch S13. The other electrode of the capacitor C12 is connected to a first input portion of a differential amplifier AMP2, whose first output portion is connected to a first input portion of a differential amplifier AMP3 and is also fed back to the first input through a switch S14.

On the other hand, an inverse input voltage $\overline{\text{VIN}}$ and an inverse reference voltage $\overline{\text{VREF}}$ respectively in the opposite phases to the input voltage VIN and the reference voltage VREF are connected to one electrode of a capacitor C21 through switches S21 and S22, respectively. The other electrode of the capacitor C21 is connected to the second input portion of the differential amplifier AMP1, whose second output portion is connected to one electrode of a capacitor C22 and is also fed back to the second input through a switch S23. The other electrode of the capacitor C22 is connected to the second input portion of the differential amplifier AMP2, whose second output portion is connected to the second input portion of the differential amplifier AMP3 and is also fed back to the second input through a switch S24.

The output (the first output or the second output) of the differential amplifier AMP3 is provided to a latch circuit 13 and the latch output LOUT outputted from the latch circuit 13 makes the output of the voltage comparator.

A differential amplifier AMP 1I is connected in parallel with the differential amplifier AMP1. Accordingly, the first input portion and the second input portion of the differential amplifier AMP11 are respectively connected to the other electrodes of the capacitors C11 and C21. The first output portion and the second output portion thereof are connected to the one electrode of the capacitor C12 and the one electrode of the capacitor C22, and are also fed back to the first input and the second input through the switches S13 and S23.

Figure 41:
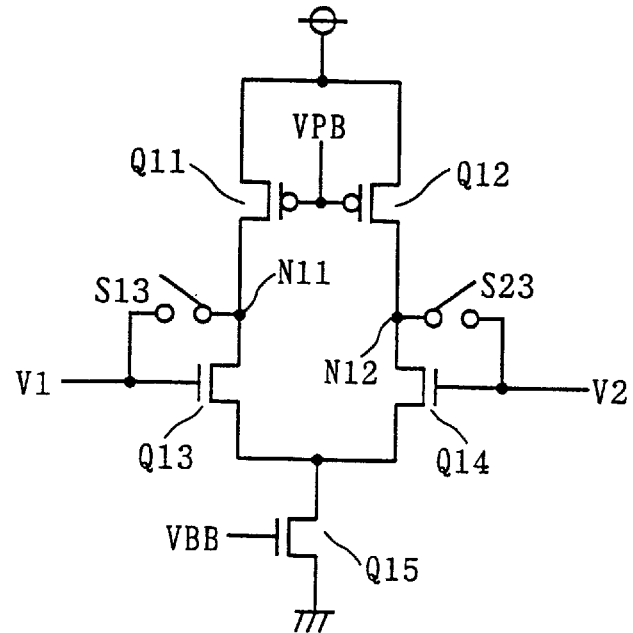
FIG. 41 is a circuit diagram showing an internal configuration of a differential amplifier having an N-type differential pair.

When the differential amplifier AMP1 (AMP2, AMP3, AMP11) has the internal configuration shown in FIG. 41, the gate of the NMOS transistor Q13 corresponds to the first input portion, the node N11 to the first output portion, the gate of the NMOS transistor Q14 to the second input portion, and the node N12 to the second output portion. Accordingly, outputted from the second output portion is an inverse amplification signal, which is a logical inversion of the amplification signal outputted from the first output portion.

The switch S11 is on/off driven in the opposite phase to the switches S12 and S22, and the switch S11, the switch S13, the switch S14, the switch S21, the switch S23, and the switch S24 are on/off driven in the same phase.

At this time, the input/output characteristics of the differential amplifier AMP1 and the differential amplifier AMP11 are set equal.

In this configuration, similarly to the second example of the first preferred embodiment, the output resistance of the first stage differential amplifiers is made smaller, since the differential amplifier AMP1 and the differential amplifier AMP11 are connected in parallel, and hence the voltages VN11 and VN12 at the input portions of the differential amplifiers AMP1 and AMP11 in the AZ period make smaller changes and are stabilized around the ideal bias voltage, even if the input signal frequency of the input voltage VIN becomes high. Accordingly, the offset voltage seen from the input side can be made small enough even if the input signal frequency becomes high, thus providing highly accurate voltage comparison. As a result, when an A/D converter is formed by using the voltage comparator of the third preferred embodiment, the A/D converter provides high accuracy.

In addition, the use of differential amplifiers provides accurate comparison between the reference voltage VREF and the input voltage VIN.

Furthermore, since the differential amplifier AMP2 is connected to the differential amplifier AMP1 through the capacitors C12 and C22, it is not necessary to make the input/output characteristic of the differential amplifier AMP2 accurately coincide with that of the differential amplifier AMP1 (the differential amplifier AMP11). The driving capability of the differential amplifier AMP2 may be enlarged when speeding up is particularly desired.

Moreover, the differential amplifier AMP2 in the next stage is not affected by the fluctuation at the input portions (output portions) of the differential amplifiers AMP1 and AMP11 in the first stage, since it is connected through the capacitors C12 and C22.

Similarly, a configuration in which the capacitors C12 and C22 and the differential amplifier AMP2 are eliminated and the first and second output portions of the differential amplifier AMP1 are connected to the first input portion and the second input portion of the differential amplifier AMP3 can stabilize the input portions of the differential amplifier AMP1 in the neighborhood of the bias voltage, when the input signal frequency of the input voltage VIN becomes high.

<<Fourth Preferred Embodiment>>

Figure 8:
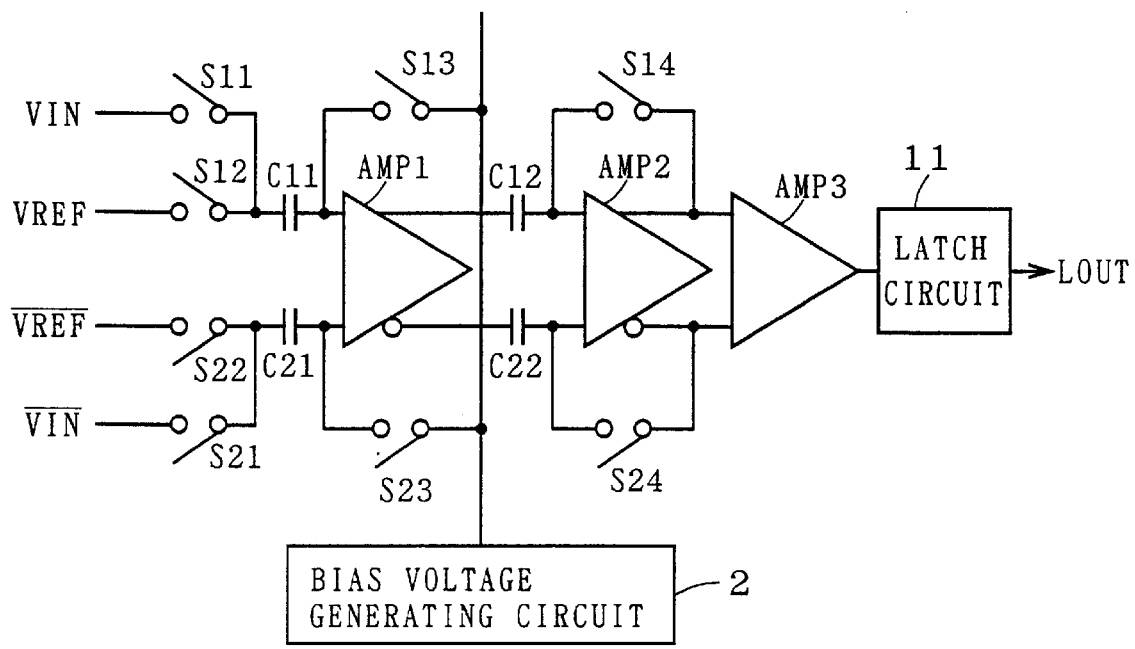
FIG. 8 is a circuit diagram showing a configuration of a chopper type voltage comparator according to a fourth preferred embodiment of the present invention.

FIG. 8 is a circuit diagram showing a configuration of a chopper type voltage comparator according to a fourth preferred embodiment of the present invention. As shown in this diagram, the output portion of a bias voltage generating circuit 2 is connected to the first input portion and the second input portion of the differential amplifier AMP1 through the switches S13 and S23, respectively. The bias voltage generating circuit 2 generates the bias voltage Vb from the low-impedance output portion. This configuration is the same as that of the third preferred embodiment shown in FIG. 7 in other respects.

The switch S11 is on/off driven in the opposite phase to the switches S12 and S22, and the switch S11, the switch S13, the switch S14, the switch S21, the switch S23 and the switch S24 are on/off driven in the same phase.

In this configuration, the supply of the bias voltage Vb from the bias voltage generating circuit 2 stabilizes the voltages VN11 and VN12 at the first and second input portions of the differential amplifier AMP1 in the AZ period (the switches S13 and S23 are in an on state) around the bias voltage Vb, even if the input signal frequency of the input voltage VIN becomes high. Accordingly, the offset voltage seen from the input side can be made small enough even if the input signal frequency becomes high, thus providing highly accurate voltage comparison. As a result, when an A/D converter is formed by using the voltage comparator of the fourth preferred embodiment, the A/D converter provides high accuracy.

At this time, an increase in power consumption is suppressed because the driving capability of the differential amplifier AMP1 itself is not enlarged.

In the fourth preferred embodiment, the differential amplifier AMP2 is further provided through the capacitor C12 and capacitor C22. Accordingly, even if variations among elements cause disagreement between the input/output characteristic of the differential amplifier AMP1 in the first stage and the bias voltage Vb, the offset voltage caused by the variations among elements of the differential amplifier AMP1 is eliminated in the capacitor C2, as long as the differential amplifier AMP2 itself is biased at a relatively high gain, not to contribute to deterioration of the accuracy of the voltage comparator.

When a parallel type A/D converter is formed by using a plurality of the chopper type voltage comparator of the fourth preferred embodiment, the bias voltage generating circuit 2 can be shared among a plurality of voltage comparators for effective utilization.

<Bias Voltage Generating Circuit>

Figure 9:
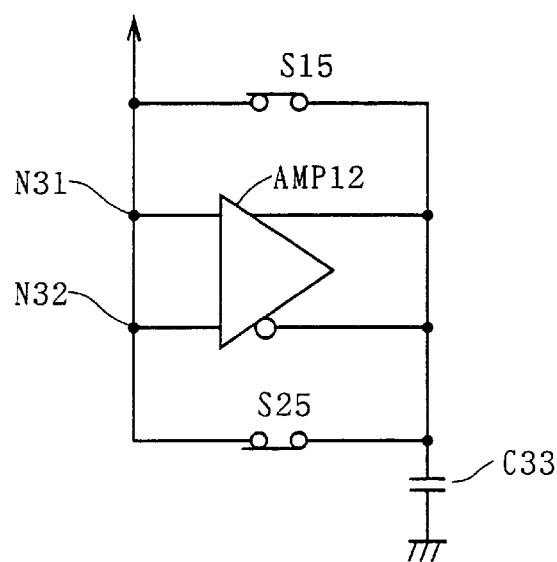
FIG. 9 is a circuit diagram showing a configuration of the bias voltage generating circuit of FIG. 8.

FIG. 9 is a circuit diagram showing an example of a configuration of the bias voltage generating circuit 2. As shown in this diagram, first input and output and second input and output of a differential amplifier AMP12 are connected respectively through switches S15 and S25, and the nodes N31 and N32 corresponding to the first and second input portions of the differential amplifier AMP12 are connected in common. The node N32 is grounded through a capacitor C33 and the signal obtained from the node N31 makes the bias voltage Vb. The differential amplifier AMP12 has the same input/output characteristic as the differential amplifier AMP2 and the switches S15 and S25 are driven in the same phase as the switches S11, S13, S14, S21, S23 and S24.

In this configuration, when the switches S15 and S25 turn on in the AZ period, the first and second inputs and outputs of the differential amplifier AMP12 are shorted and the bias voltage Vb is outputted from the node N31. The capacitor C33 is provided for impedance reduction for high-frequency input.

The capacitors C12 and C22 and the differential amplifier AMP2 may be eliminated and the first and second output portions of the differential amplifier AMP1 may be connected to the first input portion and the second output portion of the differential amplifier AMP3, respectively. When the input signal frequency of the input voltage VIN becomes high, this configuration can stabilize the input portions of the differential amplifier AMP1 in the neighborhood of the bias voltage, as well.

<<Fifth Preferred Embodiment>>

Figure 10:
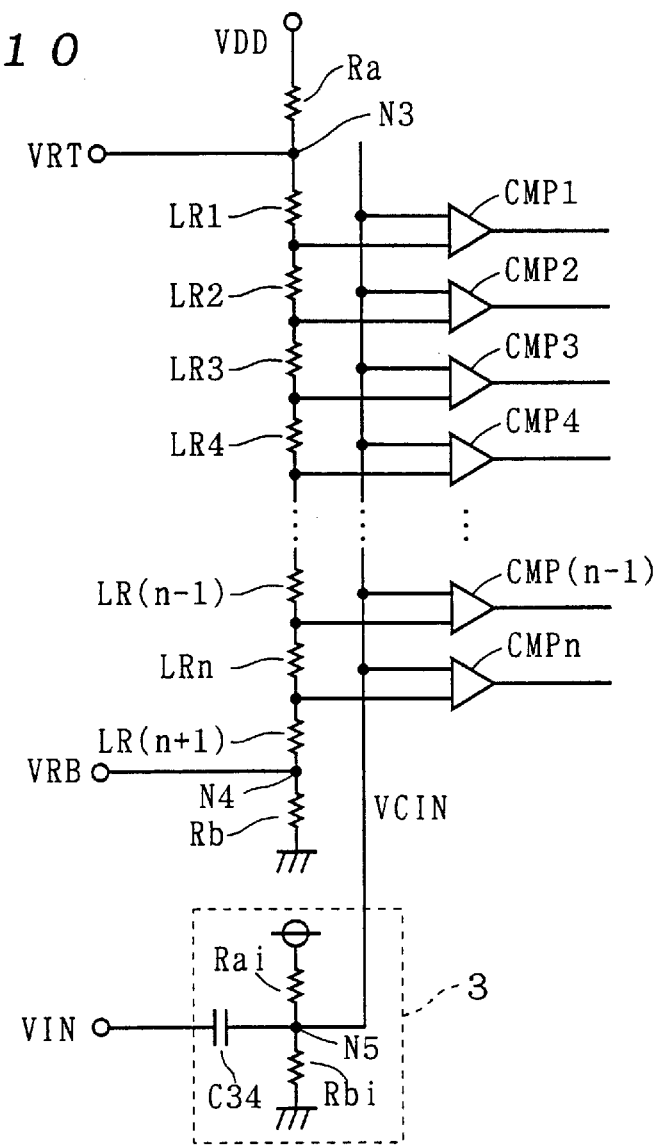
FIG. 10 is a circuit diagram showing a configuration of an external input converting portion of a chopper type voltage comparator according to a fifth preferred embodiment of the present invention.

FIG. 10 is a circuit diagram showing a configuration of an external input converting portion of a chopper type voltage comparator according to a fifth preferred embodiment. Provided between nodes N3 and N4 for the reference voltages VRT and VRB are (n+1) ladder resistors LR1–LR(N+1) connected in series. The node N3 is provided with the power-supply voltage VDD through a resistor Ra and the node N4 is grounded through a resistor Rb.

When the entire resistance value of the ladder resistors LR1–LR(n+1) is taken as RLAD, the resistor Ra satisfies Ra>(Rb+RLAD). Accordingly, the reference voltage VRT can be set to VDD/2 or lower.

On the other hand, the input voltage VIN obtained from outside is converted into a conversion input voltage VCIN in an input level setting circuit 3. The input level setting circuit 3 includes a resistor Rai and a resistor Rbi connected in series between the power supply and the ground level and the node N5 between the resistor Rai and the resistor Rbi receives the input voltage VIN through a capacitor C34.

Setting the resistance ratio of the resistors Rai and Rbi to 2:1 provides a conversion input voltage VCIN having DC offset at the VDD/3 level with the input range set to VDD/2 or lower.

In the n voltage comparators CMP1–CMPn, one input of a voltage comparator CMPi (i=1 to n) is provided with the conversion input voltage VCIN obtained by level converting the input voltage VIN and the other input is provided with the reference tap voltage Vri obtained from the node between the ladder resistors Lri and LR(i+1). The outputs of the voltage comparators CMP1–CMPn are provided to an encoder not shown, which outputs an encoded result on the basis of the outputs of the voltage comparators CMP1–CMPn.

Figure 11:
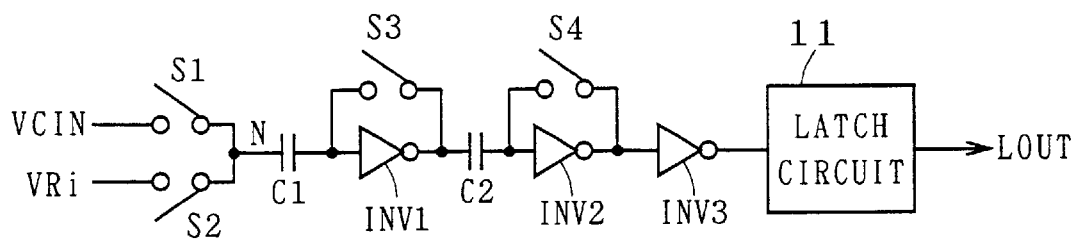
FIG. 11 is a circuit diagram showing an internal configuration of the chopper type voltage comparator of FIG. 10.
Figure 46:
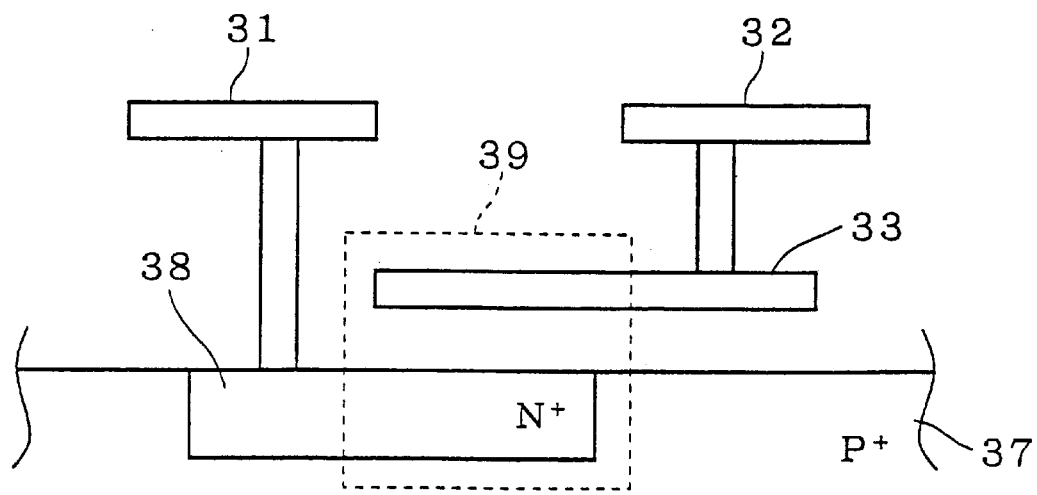
FIG. 46 is an explanation drawing showing a sectional structure of an MOS capacitor having a semiconductor electrode as its one electrode.
Figure 47:
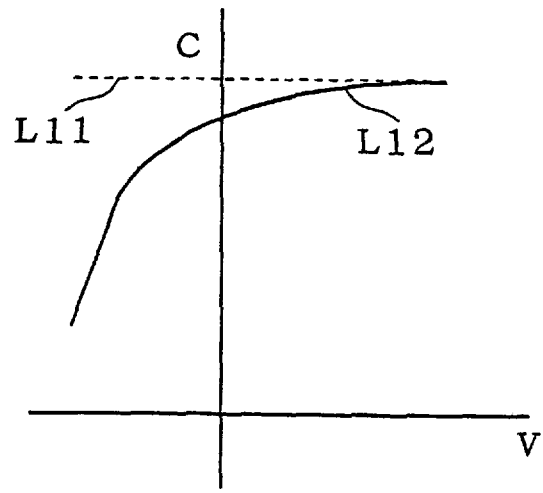
FIG. 47 is a graph showing the capacitance value characteristic of an MOS capacitor.
Figure 48:
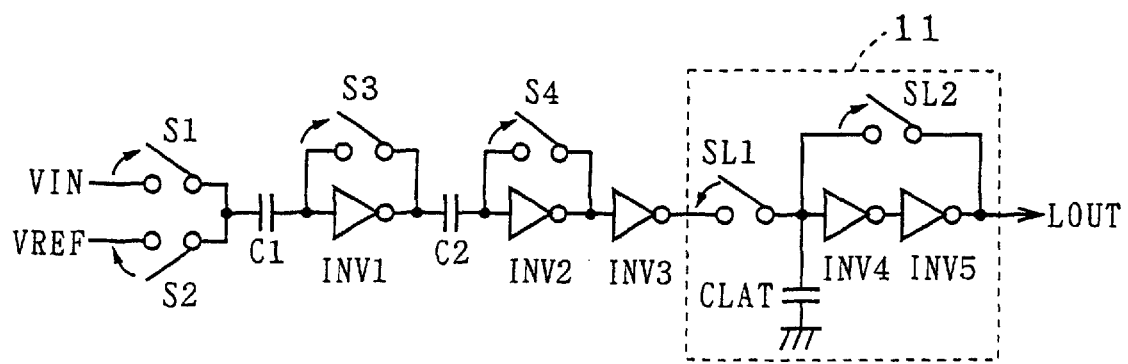
FIG. 48 is an explanation drawing showing a problem caused by kickback from the latch circuit 11.
Figure 49:
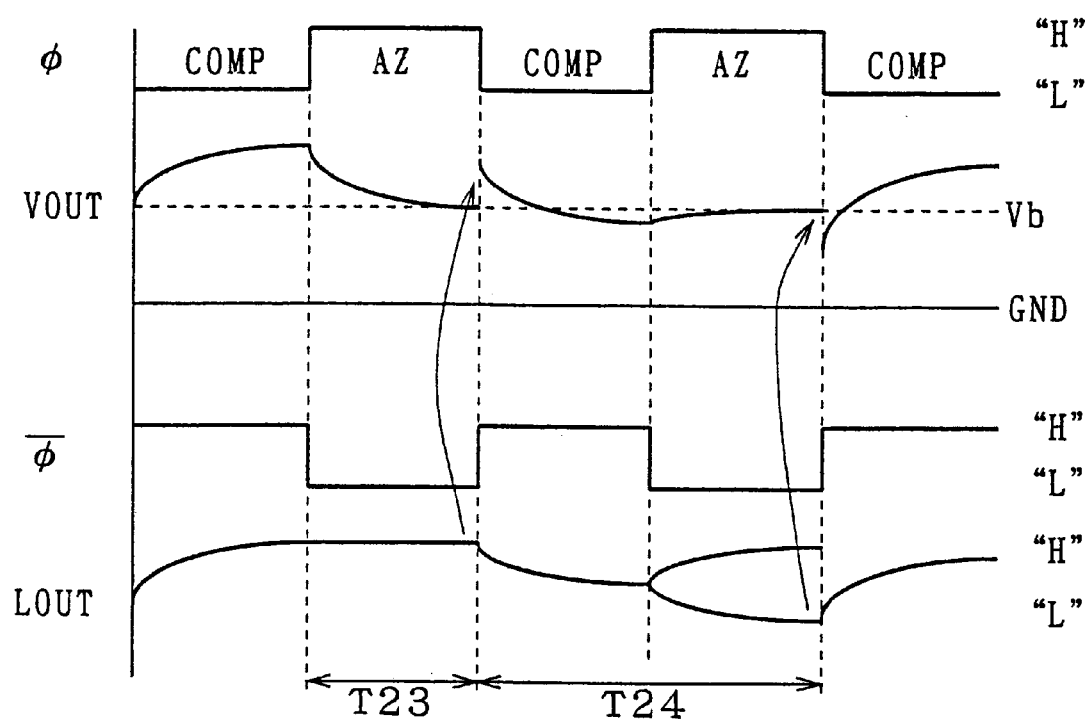
FIG. 49 is a timing diagram showing the operation of the chopper type voltage comparator with the problem shown in FIG. 48.

Each voltage comparator CMPi has the same internal configuration as the common chopper type voltage comparator shown in FIG. 11. However, note that the capacitor C1 is an MOS capacitor having such a structure as shown in FIG. 46. Since the lower electrode of the capacitor C1 in the chopper type voltage comparator is usually set on the input side, the one electrode of the capacitor C1 corresponds to the semiconductor electrode (the $N^+$ diffusion region 38). That is, the semiconductor electrode having larger parasitic capacitance is used as an input to prevent reduction of the transfer rate of the coupling capacitance part. Hereinafter, for convenience, the semiconductor electrode side of a capacitor is shown at N in the circuit diagrams including FIG. 11.

Figure 12:
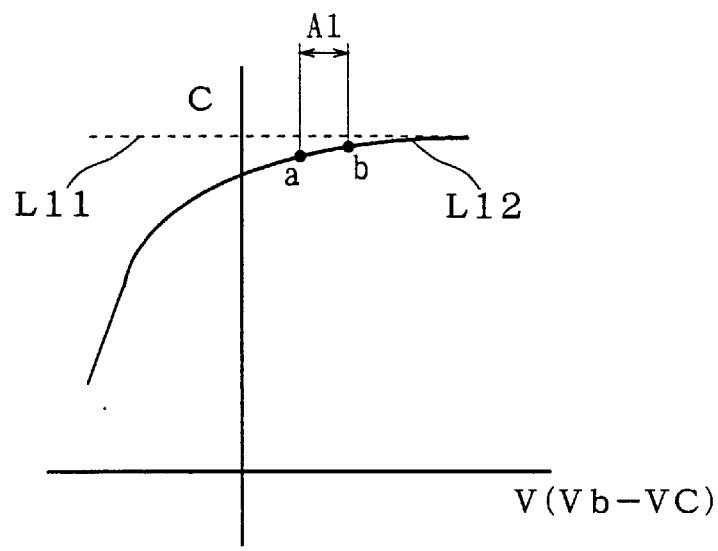
FIG. 12 is an explanation drawing showing the effect of the fifth preferred embodiment.

When the voltage VC (the reference voltage Vri and the conversion input voltage VCIN) provided to the one electrode of the capacitor C1 is suppressed to VDD/2 or lower by using the external input converting portion of the chopper type voltage comparator of the fifth preferred embodiment, the potential at the semiconductor electrode of the capacitor C1 is certainly lower than the bias voltage Vb (VDD/2 ) of the inverter amplifier. Then the capacitor C1 can be operated in the operating region A1 with relatively small voltage dependence, as shown in FIG. 12.

As result, the capacitance value of the capacitor C1 in each voltage comparator forming the parallel type A/D converter does not largely change depending on the bias level, or the input level, or the position of the comparator forming the parallel type A/D, enabling highly accurate voltage comparison and hence a highly accurate A/D converter.

When the capacitor C1 shown in FIG. 11 is an MOS capacitor having a $P^+$ diffusion region as a semiconductor electrode, the voltage VC (the reference voltage Vri and the conversion input voltage VCIN) provided to the one electrode (the semiconductor electrode) of the capacitor C1 is a set to VDD/2 or higher with the same principle.

<<Sixth Preferred Embodiment>>

Figure 13:
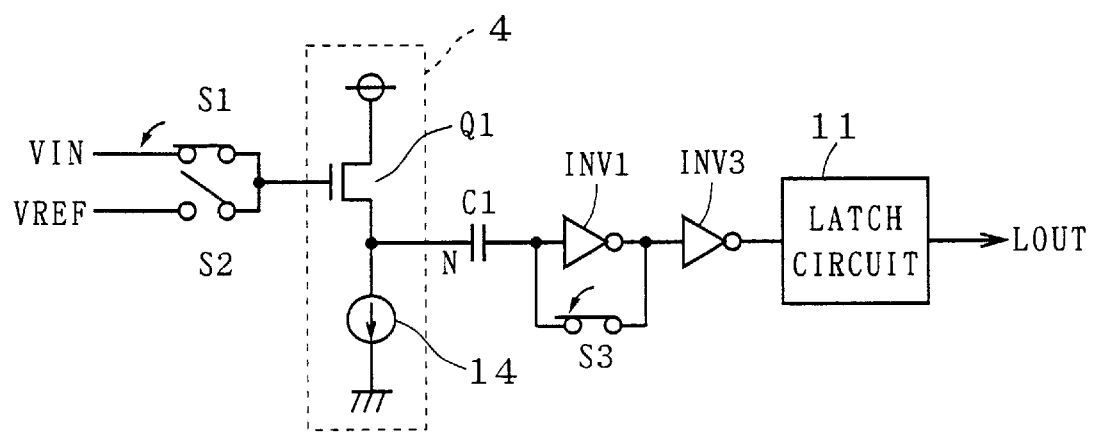
FIG. 13 is a circuit diagram showing a configuration of a chopper type voltage comparator according to a sixth preferred embodiment of the present invention.

FIG. 13 is a circuit diagram showing a configuration of a chopper type voltage comparator according to a sixth preferred embodiment of the present invention. As shown in this diagram, the input voltage VIN and the reference voltage VREF are connected to the input portion of a level shift circuit 4 through the switches S1 and S2 and the output portion of the level shift circuit 4 is connected to one electrode of the capacitor C1. The other electrode of the capacitor C1 is connected to the input portion of the inverter INV1. The output portion of the inverter INV1 is connected to the input portion of the inverter INV3 and is also fed back to the input through the switch S3. The output VOUT from the inverter INV3 is provided to the latch circuit 11 and the latch output LOUT outputted from the latch circuit 11 makes the output of the voltage comparator. The switches S1 and the switch S2 are driven in opposite phases and the switch S1 and the switch S3 are driven in the same phase.

The level shift circuit 4 is formed of an NMOS transistor Q1 and a constant-current source 14. The NMOS transistor Q1 has its drain connected to the power-supply VDD and its source grounded through the constant-current source 14. The gate of the NMOS transistor Q1 serves as the input portion and the source as the output portion. Thus the level shift circuit 4 is a source follower circuit of the NMOS transistor Q1. This configuration lowers the levels of the analog input and the reference voltage input by a certain level (by a level corresponding to the threshold voltage of the MOS transistor Q1 plus a voltage based on the supply current by the constant-current source 14).

Thus, in the chopper type voltage comparator of the sixth preferred embodiment, the voltage VC (the reference voltage VREF and the input voltage VIN) provided to one electrode of the capacitor C1 is suppressed low by the level shift circuit 4, so that the potential at the semiconductor electrode of the capacitor C1 is a lower than the bias voltage Vb of the inverter amplifier, which allows the capacitor C1 to operate in the operating region A1 with relatively small voltage dependence, as shown in FIG. 12.

As a result, the capacitance value of the capacitor C1 in the voltage comparator does not largely change with the bias level, thus providing highly accurate voltage comparison. Accordingly, when a parallel to type A/D converter is formed by using the voltage comparator of the sixth preferred embodiment as shown in FIG. 10, the A/D converter provides high accuracy.

<<Seventh Preferred Embodiment>>

Figure 14:
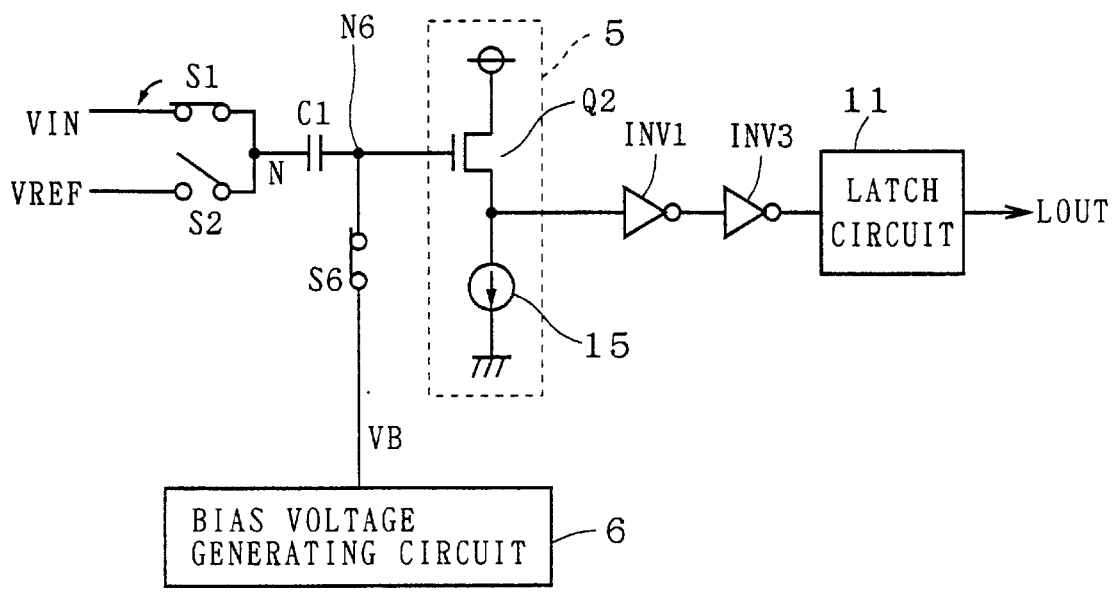
FIG. 14 is a circuit diagram showing a configuration of a chopper type voltage comparator according to a seventh preferred embodiment of the present invention.

FIG. 14 is a circuit diagram showing a configuration of a chopper type voltage comparator according to a seventh preferred embodiment of the present invention. As shown in this diagram, the input voltage VIN and the reference voltage VREF are connected to one electrode of the capacitor C1 through the switches S1 and S2, respectively. The other electrode of the capacitor C1 is connected to the input portion of a level shift circuit 5 and is also connected to the output portion of a bias voltage generating circuit 6 through a switch S6. The output portion of the level shift circuit 5 is connected to the input portion of the inverter INV1. The output portion of the inverter INV1 is connected only to the input of the inverter INV3. The same parts as those in FIG. 13 are shown at the same reference characters and not fully described again.

The bias voltage generating circuit 6 generates a bias VB which is sufficiently larger than the voltage VC (the reference voltage VREF and input voltage VIN) provided to one electrode of the capacitor C1. The switch S6 is driven in the same phase as the switch S1.

The level shift circuit 5 is formed of an NMOS transistor Q2 and a constant-current source 15. The drain of the NMOS transistor Q2 is connected to the power supply VDD and the source is grounded through the constant-current source 15. The gate of the NMOS transistor Q2 serves as the input portion and the source as the output portion. Thus the level shift circuit 5 is a source follower circuit of the NMOS transistor Q2. This configuration lowers the potential at the node N6 by the amount of shift $\Delta V5$ and gives it to the input portion of the inverter INV1. Accordingly, in the AZ period in which the switches S1 and S6 are in an on state, the bias voltage VB (Vb+$\Delta$V5) is level-shifted to the bias voltage Vb fitted to the inverter INV1 by the level shift circuit 5.

Thus, according to the chopper type voltage comparator of the seventh preferred embodiment, the bias voltage VB provided to the other electrode of the capacitor C1 by the bias voltage generating circuit 6 is set higher than the voltage VC (the reference voltage VREF and the input voltage VIN) provided to its one electrode, so that the capacitor C1 can operate in the operating region A1 with relatively low voltage dependence, as shown in FIG. 12. Furthermore, shifting the input portion of the inverter INV1 to the bias voltage Vb by the level shift circuit enables normal operation of the inverter INV1.

Then the capacitance value of the capacitor C1 in the voltage comparator will not largely change with the bias level, enabling highly accurate voltage comparison. Accordingly, when a parallel type A/D converter is formed as shown in FIG. 10 by using the voltage comparator of the seventh preferred embodiment, the A/D converter provides high accuracy. <Bias Voltage Generating Circuit>

Figure 15:
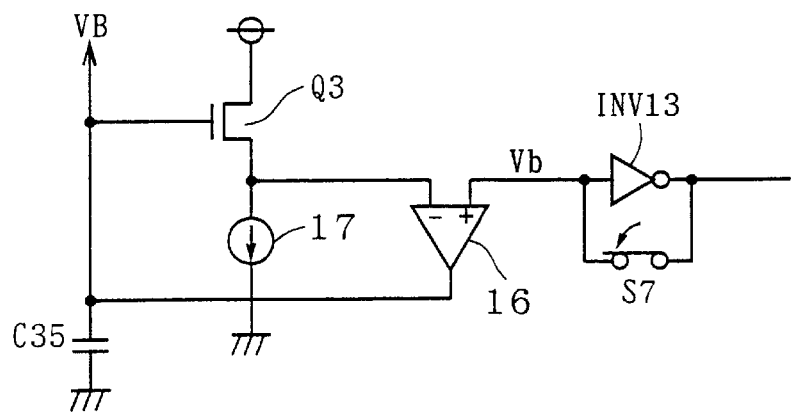
FIG. 15 is a circuit diagram showing a configuration of the bias voltage generating circuit of FIG. 14.

FIG. 15 is a circuit diagram showing an example of the internal configuration of the bias voltage generating circuit 6. As shown in this diagram, the input and output of an inverter INV13 are connected through a switch S7 and the input portion of the inverter INV13 is connected to the positive input portion of a voltage comparator 16. On the other hand, an NMOS transistor Q3 and a constant-current source 17 are connected in series between the power supply and the ground level, and the source of the NMOS transistor Q3 is connected to the negative input portion of the voltage comparator 16. The output of the voltage comparator 16 is outputted as the bias voltage VB and is also grounded through a capacitor C35.

The input/output characteristic of the inverter INV13 is set equal to that of the inverter INV1 and the level shift circuit formed of the NMOS transistor Q3 and the constant-current source 17 has the same amount of level shift, $\Delta V5$, as the level shift circuit 5. The switch S7 is driven in the same phase as the switches S1 and S6. The capacitor C35 stabilizes the bias voltage VB and prevents oscillation of the feedback system of the voltage comparator 16.

With this configuration, the bias voltage VB generated from the bias voltage generating circuit 6 in the AZ period is correctly (Vb+ΔV5). Accordingly, it is possible to correctly set the bias voltage Vb of the inverter INV1 to a high-gain (good gain characteristic) point.

Figure 16:
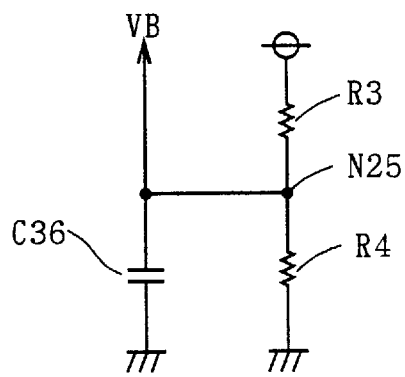
FIG. 16 is a circuit diagram showing a configuration of the bias voltage generating circuit of FIG. 14.

FIG. 16 is a circuit diagram showing another example of a configuration of the bias voltage generating circuit. As shown in this diagram, resistors R3 and R4 are connected in series between the power supply VDD and ground and the node N25 between the resistors R3 and R4 is grounded through a capacitor C36. The signal obtained from the node N25 is used as the bias voltage VB. The capacitor C36 is provided to reduce the impedance for high-frequency input.

The configuration shown in FIG. 16 is advantageous in that it can be realized with a simple configuration when very high accuracy is not required for the bias voltage VB.

<<Eighth Preferred Embodiment>>

Figure 17:
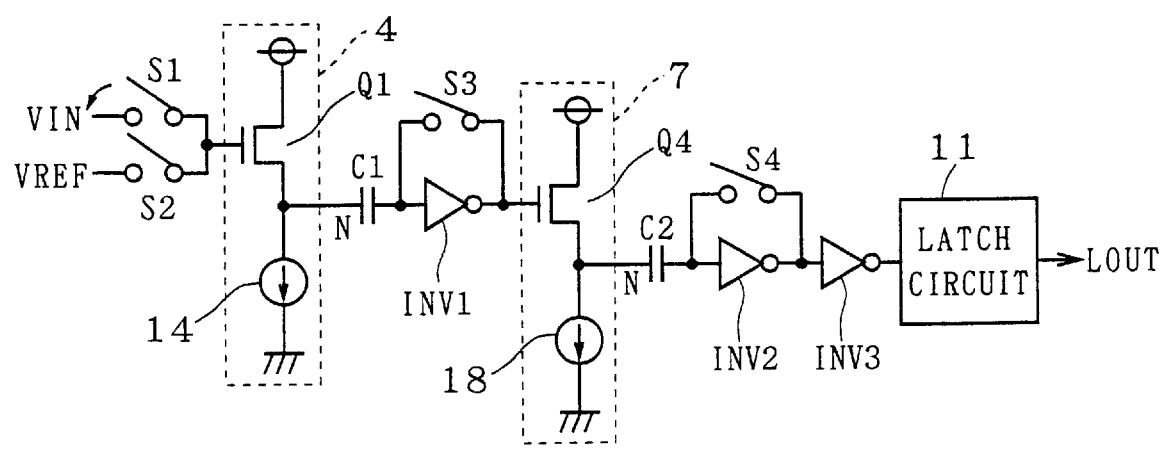
FIG. 17 is a circuit diagram showing a configuration of a chopper type voltage comparator according to an eighth preferred embodiment of the present invention.

FIG. 17 is a circuit diagram showing a configuration of a chopper type voltage comparator according to an eighth preferred embodiment of the present invention. As shown in this diagram, the input voltage VIN and the reference voltage VREF are connected to the input portion of the level shift circuit 4 through the switches S1 and S2, respectively, and the output portion of the level shift circuit 4 is connected to one electrode of the capacitor C1. The other electrode of the capacitor C1 is connected to the input portion of the inverter INV1 and the output portion of the inverter INV1 is connected to the input portion of a level shift circuit 7 and is also fed back to the input through the switch S3. The output portion of the level shift circuit 7 is connected to one electrode of the capacitor C2 and the other electrode of the capacitor C2 is connected to the input portion of the inverter INV2. The output portion of the inverter INV2 is connected to the input portion of the inverter INV3 and is also fed back to the input through the switch S4. The output VOUT of the inverter INV3 is provided to the latch circuit 11 and the latch output LOUT outputted from the latch circuit 11 makes the output of the voltage comparator. The switch S1 and the switch S2 are driven in opposite phases, and the switch S1, the switch S3 and the switch S5 are driven in the same phase. The same parts as those in FIG. 13 are shown at the same reference characters and are not fully described again.

Note that the capacitor C2 is, as well as the capacitor C1, an MOS capacitor having such a structure as shown in FIG. 46, one electrode of which is a semiconductor electrode.

The level shift circuit 7 is formed of an NMOS transistor Q4 and a constant-current source 18, with the NMOS transistor Q4 having its drain connected to the power supply VDD and its source grounded through the constant-current source 18. The gate of the NMOS transistor Q4 serves as the input portion and its source as the output portion. This configuration can lower the output level of the inverter INV1 by a certain level (a level corresponding to the threshold voltage of the NMOS transistor Q4 plus a voltage based on the supply current by the constant-current source 18).

Thus, according to the chopper type voltage comparator of the eighth preferred embodiment, the voltage VC (the reference voltage VREF and the input voltage VIN) provided to one electrode of the capacitor C1 is suppressed low by the level shift circuit 4 to allow the capacitor C1 in the voltage comparator to operate in an operating region with small voltage dependence.

Furthermore, the voltage provided to one electrode of the capacitor C2 is suppressed low by the level shift circuit 7 to allow the capacitor C2 in the voltage comparator to operate in an operating region with small voltage dependence.

As a result, the chopper type voltage comparator of the eighth preferred embodiment can make the voltage comparison very accurately. Therefore, when a parallel type A/D converter is formed as shown in FIG. 10 by using the voltage comparator of the eighth preferred embodiment, the A/D converter provides high accuracy.

Although the level shift circuit 4 used in the fifth preferred embodiment is used as a capacitance value stabilizing means for the capacitor C1 in the eighth preferred embodiment, the external input converting portion of the fifth preferred embodiment (refer to FIG. 10), the level shift circuit 5 and the bias voltage generating circuit 6 of the seventh preferred embodiment (FIG. 14) may be provided instead.

<<Ninth Preferred Embodiment>>

Figure 18:
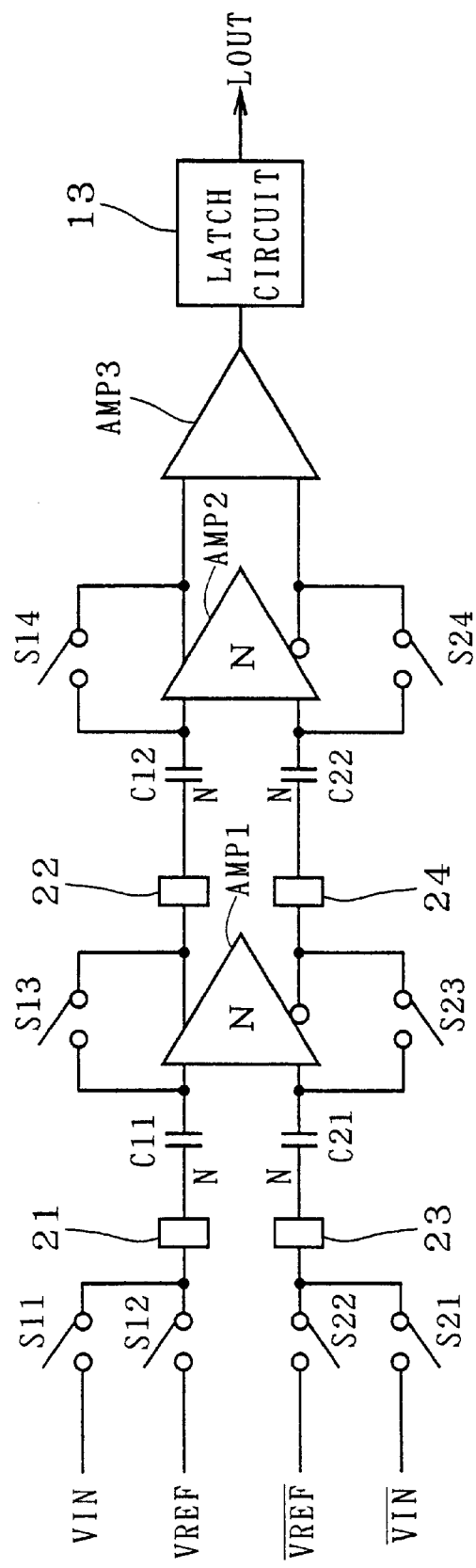
FIG. 18 is a circuit diagram showing a configuration of a chopper type voltage comparator according to a ninth preferred embodiment of the present invention.

FIG. 18 is a circuit diagram showing a configuration of a chopper type voltage comparator according to a ninth preferred embodiment of the present invention. As shown in this diagram, the input voltage VIN and the reference voltage VREF are connected to the input portion of a level shift circuit 21 through the switches S11 and S12, respectively. The output portion of the level shift circuit 21 is connected to one electrode of the capacitor C11. The other electrode of the capacitor C11 is connected to the first input portion of the differential amplifier AMP1. The first output portion of the differential amplifier AMP1 is connected to the input portion of a level shift circuit 22 and is also fed back to the first input through the switch S13. The output portion of the level shift circuit 22 is connected to one electrode of the capacitor C12 and the other electrode of the capacitor C12 is connected to the first input portion of the differential amplifier AMP2. The first output portion of the differential amplifier AMP2 is connected to the first input portion of the differential amplifier AMP3 and is also fed back to the first input through the switch S14.

On the other hand, the inverse input voltage $\overline{\text{VIN}}$ and the inverse reference voltage $\overline{\text{VREF}}$ respectively in the opposite phases to the input voltage VIN and the reference voltage VREF are connected to the input portion of a level shift circuit 23 through the switches S21 and S22, respectively, and the output portion of the level shift circuit 23 is connected to one electrode of the capacitor C21. The other electrode of the capacitor C21 is connected to the second input portion of the differential amplifier AMP1, whose second output portion is connected to the input portion of a level shift circuit 24 and is also fed back to the second input through the switch S23. The output portion of the level shift circuit 24 is connected to one electrode of the capacitor C22 and the other electrode of the capacitor C22 is connected to the second input portion of the differential amplifier AMP2. The second output portion of the differential amplifier AMP2 is connected to the second input portion of the differential amplifier AMP3 and is also fed back to the second input through the switch S24.

The output of the differential amplifier AMP3 (the first output or the second output) is provided to the latch circuit 13 and the latch output LOUT outputted from the latch circuit 13 makes the output of the voltage comparator.

The capacitors C11, C12, C21 and C22 are each an MOS capacitor having such a structure as shown in FIG. 46, one electrode of each being an N-type semiconductor electrode.

When the N-type differential amplifiers AMP1 and AMP2 have the configuration shown in FIG. 41, the gate of the NMOS transistor Q13 corresponds to the first input portion, the node N11 to the first output portion, the gate of the NMOS transistor Q14 to the second input portion, and the node N12 to the second output portion.

The switch S11 is on/off driven in the opposite phase to the switches S12 and S22, and the switch S11, the switch S13, the switch S14, the switch S21, the switch S23, and the switch S24 are on/off driven in the same phase.

The level shift circuits 21 and 23 are equivalent to the level shift circuit 4 and the level shift circuits 22 and 24 are equivalent to the level shift circuit 7.

Thus, according to the chopper type voltage comparator of the ninth preferred embodiment, the voltage VC (the reference voltage VREF and the conversion input voltage VIN) provided to one electrode of the capacitor C11 and to one electrode of the capacitor C21 is suppressed low by the level shift circuits 21 and 23, so that the capacitors C11 and C21 in the voltage comparator can operate in an operating region with small voltage dependence.

Furthermore, the voltage provided to one electrode of the capacitor C2 is suppressed low by the level shift circuits 22 and 24, so that the capacitors C12 and C22 in the voltage comparator can operate in an operating region with small voltage dependence.

As a result, the chopper type voltage comparator of the ninth preferred embodiment provides highly accurate voltage comparison. Accordingly, when a parallel type A/D converter is formed as shown in FIG. 10 by using the voltage comparator of the ninth preferred embodiment, the A/D converter provides high accuracy.

In addition, the use of differential amplifiers provides more accurate comparison between the reference voltage VREF and the input voltage VIN.

<<Tenth Preferred Embodiment>>

Figure 19:
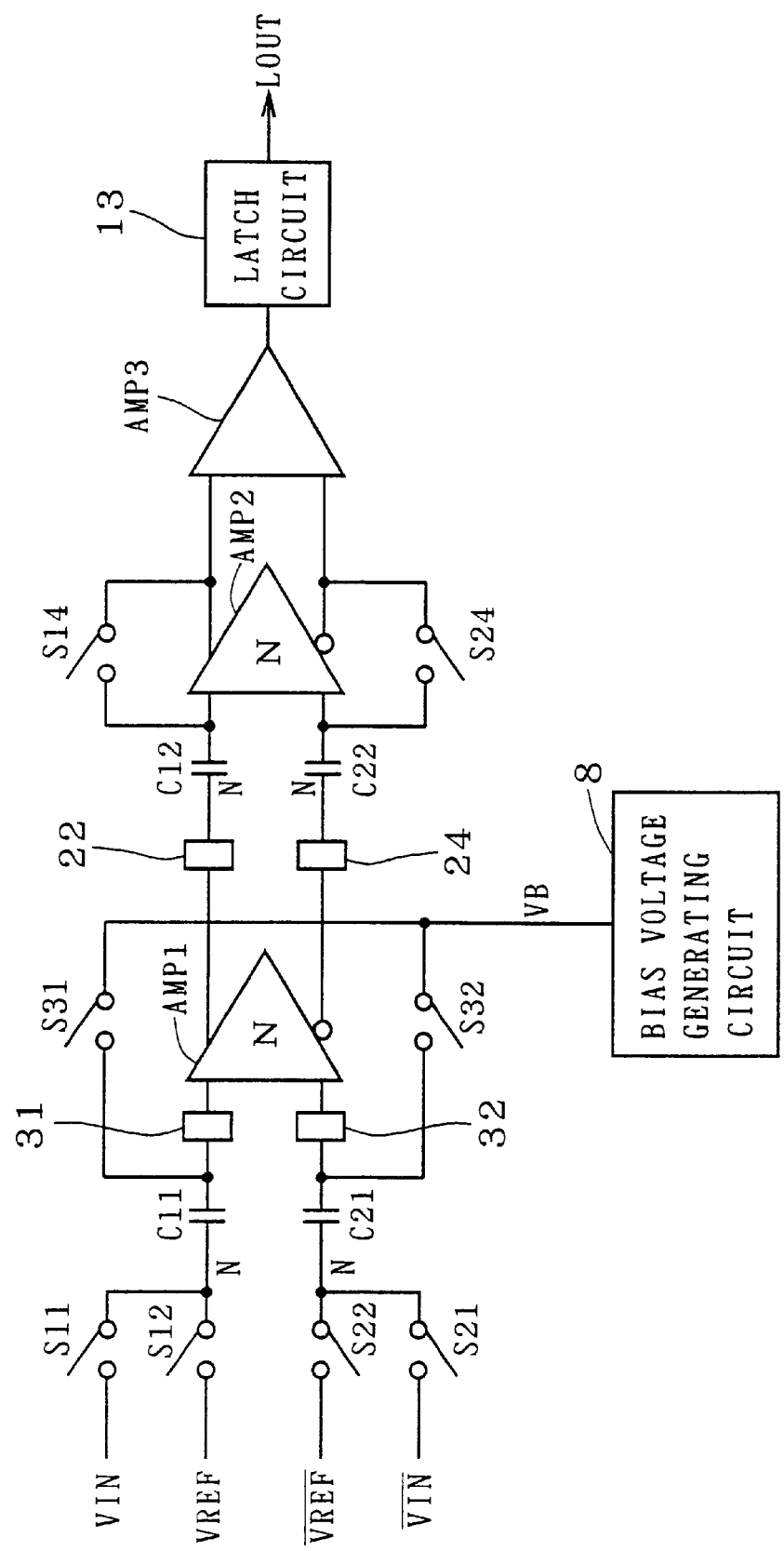
FIG. 19 is a circuit diagram showing a configuration of a chopper type voltage comparator according to a tenth preferred embodiment of the present invention.

FIG. 19 is a circuit diagram showing a configuration of a chopper type voltage comparator according to a tenth preferred embodiment of the present invention. As shown in this diagram, the input voltage VIN and the reference voltage VREF are connected to one electrode of the capacitor C11 through the switches S11 and S12, respectively. The other electrode of the capacitor C11 is connected to the input portion of a level shift circuit 31. The output portion of the level shift circuit 31 is connected to the first input portion of the differential amplifier AMP1, and the first output of the differential amplifier AMP1 is connected only to the input portion of a level shift circuit 22. The bias voltage VB is provided from a bias voltage generating circuit 8 to the other electrode of the capacitor C11 through a switch S31.

On the other hand, the inverse input voltage $\overline{\text{VIN}}$ and the inverse reference voltage $\overline{\text{VREF}}$ respectively in the opposite phases to the input voltage VIN and the reference voltage VREF are connected to one electrode of the capacitor C21 through the switches S21 and S22, respectively. The other electrode of the capacitor C21 is connected to the input portion of a level shift circuit 32. The output portion of the level shift circuit 32 is connected to the second input portion of the differential amplifier AMP1 and the second output portion of the differential amplifier AMP1 is connected only to the input portion of a level shift circuit 24. The bias voltage VB is provided to the other electrode of the capacitor C21 from the bias voltage generating circuit 8 through a switch S32. The same parts as those in FIG. 18 are shown at the same reference characters and not fully described again.

The switch S1I is on/off driven in the opposite phase to the switches S12 and S22, and the switch S11, the switch S31, the switch S14, the switch S21, the switch S32 and the switch S24 are on/off driven in the same phase.

The level shift circuits 31 and 32 are equivalent to the level shift circuit 5 and the bias voltage generating circuit 8 is equivalent to the bias voltage generating circuit 6.

Thus, in the chopper type voltage comparator of the tenth preferred embodiment, the bias voltage VB provided to the other electrodes of the capacitors C11 and C21 by the bias voltage generating circuit 8 is set higher than the voltage VC (the reference voltage VREF and the input voltage VIN) provided to their one electrodes so that the capacitors C11 and C21 can operate in the operating region with small voltage dependence. The level shift circuits 31 and 32 level-shift the first and second input portions of the differential amplifier AMP1 to the bias voltage Vb to enable normal operation of the differential amplifier AMP1.

Furthermore, the level shift circuits 22 and 24 suppress low the voltage provided to one electrode of each of the capacitors C12 and C22 to allow the capacitors C12 and C22 in the voltage comparator to operate in the small voltage dependence operating region.

This allows the chopper type voltage comparator of the tenth preferred embodiment to perform highly accurate voltage comparison. Accordingly, when a parallel type A/D converter is formed by using the voltage comparator of the tenth preferred embodiment, the A/D converter provides high accuracy.

In addition, the use of differential amplifiers further improves the accuracy of the comparison between the reference voltage VREF and the input voltage VIN.

<Bias Voltage Generating Circuit>

Figure 20:
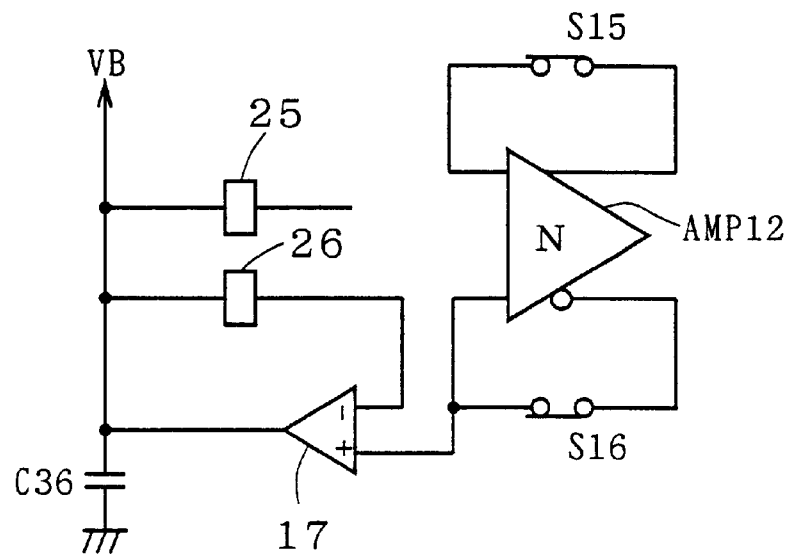
FIG. 20 is a circuit diagram showing a configuration of the bias voltage generating circuit of FIG. 19.

FIG. 20 is a circuit diagram showing an example of a configuration of the bias voltage generating circuit 8. The first output portion of a differential amplifier AMP12 is fed back to the first input through a switch S15 and the second output portion of the differential amplifier AMP12 is fed back to the second input through a switch S16. The second input portion of the differential amplifier AMP12 is connected to the positive input of a voltage comparator 17 and the bias voltage VB, or the output from the voltage comparator 17, is fed back to the negative input through a level shift circuit 26. A capacitor C36 is provided between the output of the voltage comparator 17 and the ground level.

The differential amplifier AMP12 has the same input/output characteristic as the differential amplifier AMP1 and the level shift circuit 26 has the same amount of level shift $\Delta V32$ as the level shift circuits 31 and 32. The switches S15 and S16 are driven in the same phase as the switches S11 and S21. The capacitor C36 stabilizes the bias voltage VB and also prevents oscillation of the feedback system of the voltage comparator 17.

With this configuration, the bias voltage VB generated from the bias voltage generating circuit 8 in the AZ period is correctly (Vb+$\Delta V32$). Accordingly, the bias voltage Vb for the differential amplifier AMP1 can be correctly set to a point with a high gain (with a good gain characteristic).

Figure 21:
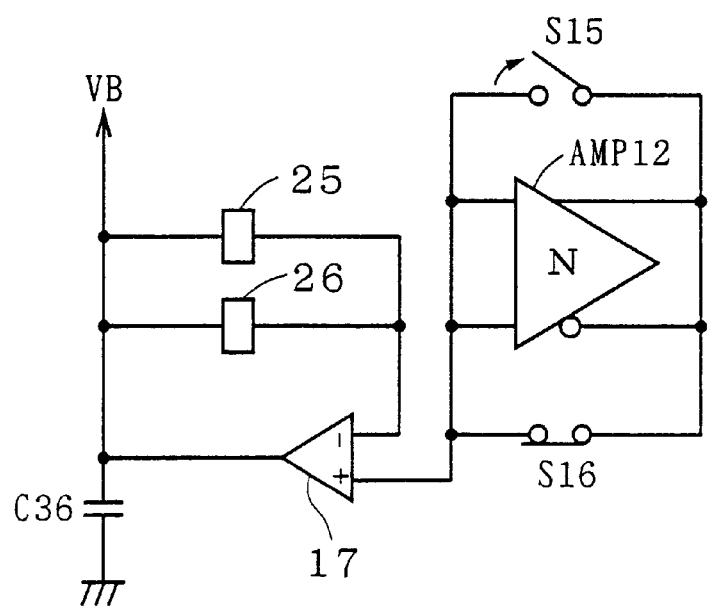
FIG. 21 is a circuit diagram showing a configuration of the bias voltage generating circuit of FIG. 19.

FIG. 21 is a circuit diagram showing another example of a configuration of the bias voltage generating circuit 8. The first and second input portions of the differential amplifier AMP12 are connected in common and the first and second output portions are connected in common. The input portions of the level shift circuits 25 and 26 are connected in common and the output portions are connected in common. The same parts as those in FIG. 20 are shown at the same reference characters and not fully described again.

Similarly to the circuit shown in FIG. 20, this configuration provides highly accurate bias voltage VB.

<<Eleventh Preferred Embodiment>>

Figure 22:
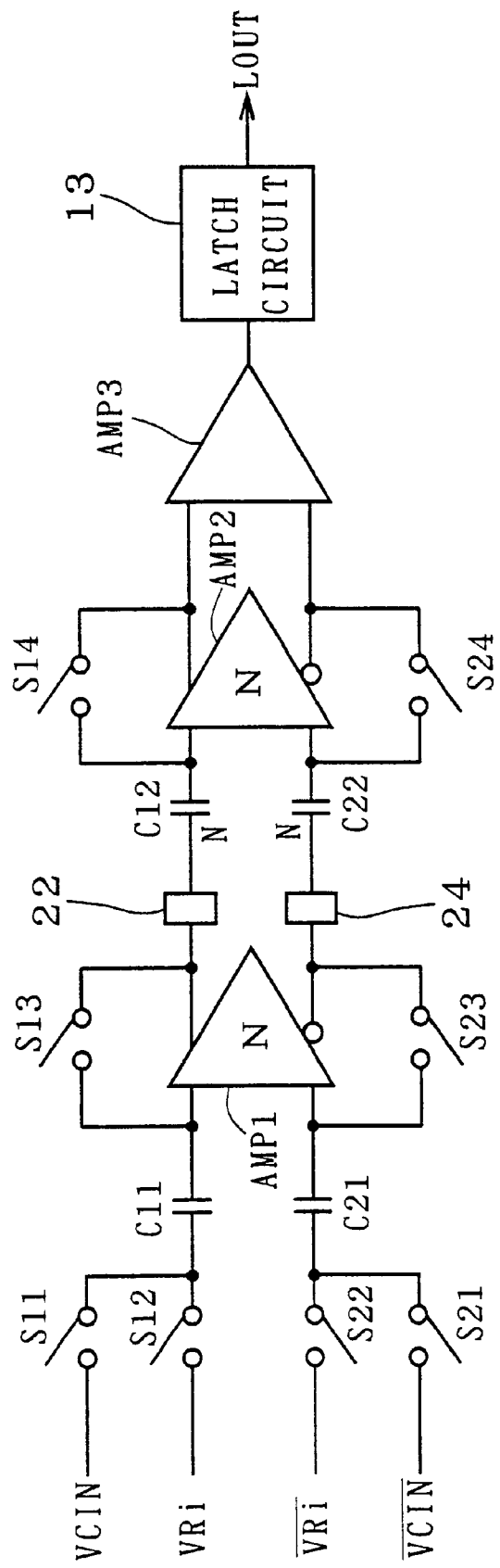
FIG. 22 is a circuit diagram showing a configuration of a chopper type voltage comparator according to an eleventh preferred embodiment of the present invention.

FIG. 22 is a circuit diagram showing a configuration of a chopper type voltage comparator according to an eleventh preferred embodiment of the present invention. As shown in this diagram, the conversion input voltage VCIN and the reference voltage Vri are connected to one electrode of the capacitor C11 through the switches S11 and S12, respectively. The other electrode of the capacitor C11 is connected to the first input portion of the differential amplifier AMP1. The first output portion of the differential amplifier AMP1 is connected to the input portion of the level shift circuit 22 and is also fed back to the first input through the switch S13.

On the other hand, the inverse conversion input voltage $\overline{\text{VCIN}}$ and the inverse reference voltage $\overline{\text{VRi}}$ respectively in the opposite phases to the conversion input voltage VCIN and the reference voltage Vri are connected to one electrode of the capacitor C21 through the switches S21 and S22, respectively. The other electrode of the capacitor C21 is connected to the second input portion of the differential amplifier AMP1, whose second output portion is connected to the input portion of the level shift circuit 24 and is also fed back to the second input through the switch S23. The reference voltage Vri and the conversion input voltage VCIN are provided by a converting circuit equivalent to the external input converting portion shown in FIG. 10. The same parts as those in FIG. 18 are shown at the same reference characters and not fully described again.

This way, in the chopper type voltage comparator of the eleventh preferred embodiment, the voltage VC (the reference voltage Vri and the conversion input voltage VCIN) provided to one electrode of each of the capacitors C11 and C21 is suppressed to VDD/2 or lower to allow the capacitor C11 and capacitor C21 to operate in an operating region with relatively small voltage dependence.

Furthermore, the level shift circuits 22 and 24 suppress low the voltage provided to one electrode of each of the capacitors C12 and C22 so that the capacitors C12 and C22 in the voltage comparator can operate in the operating region with small voltage dependence.

As a result, the chopper type voltage comparator of the eleventh preferred embodiment is capable of highly accurate voltage comparison. Accordingly, when a parallel type A/D converter is formed as shown in FIG. 10 by using the voltage comparator of the eleventh preferred embodiment, the A/D converter provides high accuracy.

In addition, the use of differential amplifiers further improves the accuracy of the comparison between the reference voltage Vri and the conversion input voltage VCIN.

<<Twelfth Preferred Embodiment>>

Figure 23:
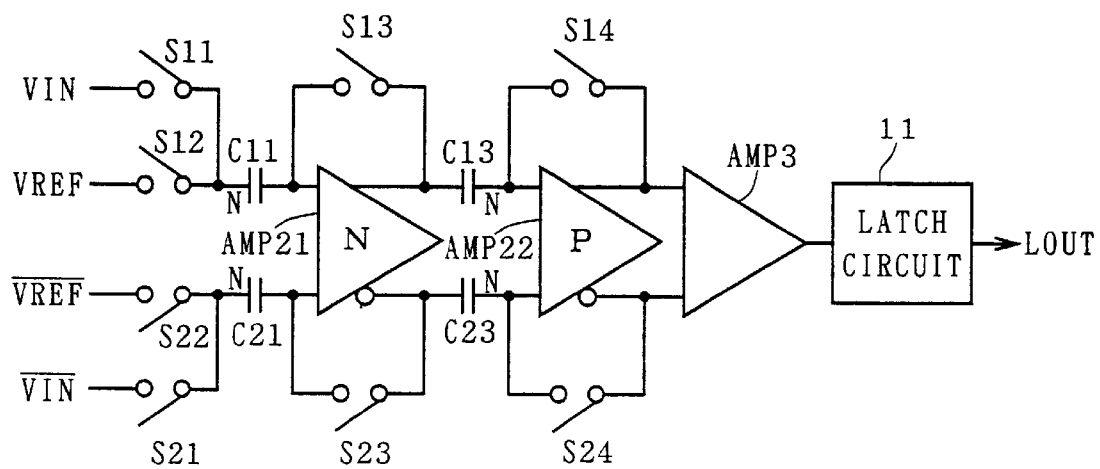
FIG. 23 is a circuit diagram showing a configuration of a chopper type voltage comparator according to a twelfth preferred embodiment of the present invention.

FIG. 23 is a circuit diagram showing a configuration of a chopper type voltage comparator according to a twelfth preferred embodiment of the present invention. As shown in this diagram, the input voltage VIN and the reference voltage VREF are connected to one electrode of the capacitor C11 through the switches S11 and S12, respectively. The other electrode of the capacitor C11 is connected to the first input portion of an N-type differential amplifier AMP21, whose first output portion is connected to one electrode of the capacitor C13 and is also fed back to the first input through the switch S13. The other electrode of the capacitor C13 is connected to the first input portion of a P-type differential amplifier AMP22. The first output portion of the differential amplifier AMP22 is connected to the first input portion of the differential amplifier AMP3 and is also fed back to the first input through the switch S14.

On the other hand, the inversion input voltage $\overline{\text{VIN}}$ and the inversion reference voltage $\overline{\text{VREF}}$ respectively in the opposite phases to the input voltage VIN and the reference voltage VREF are connected to one electrode of the capacitor C21 through the switches S21 and S22, respectively. The other electrode of the capacitor C21 is connected to the second input portion of the differential amplifier AMP21. The second output portion of the differential amplifier AMP21 is connected to one electrode of the capacitor C23 and is also fed back to the second input through the switch S23. The other electrode of the capacitor C23 is connected to the second input portion of the differential amplifier AMP22, and the second output portion of the differential amplifier AMP22 is connected to the second input portion of the differential amplifier AMP3 and is also fed back to the second input through the switch S24. The same parts as those in FIG. 18 are shown at the same reference characters and not fully described again.

The capacitors C11, C13, C21 and C23 are MOS capacitors having such a structure as shown in FIG. 46, and one electrode of the capacitors C11 and C21 is a semiconductor electrode and the other electrode of the capacitors C13 and C23 is a semiconductor electrode.

In the N-type differential amplifier AMP21, as shown in FIG. 41, the NMOS transistors Q13 and Q14 forming a differential pair are N-type differential amplifiers, and the gate of the NMOS transistor Q13 corresponds to the first input portion, the node N11 to the first output portion, the gate of the NMOS transistor Q14 to the second input portion, and the node N12 to the second output portion.

Figure 42:
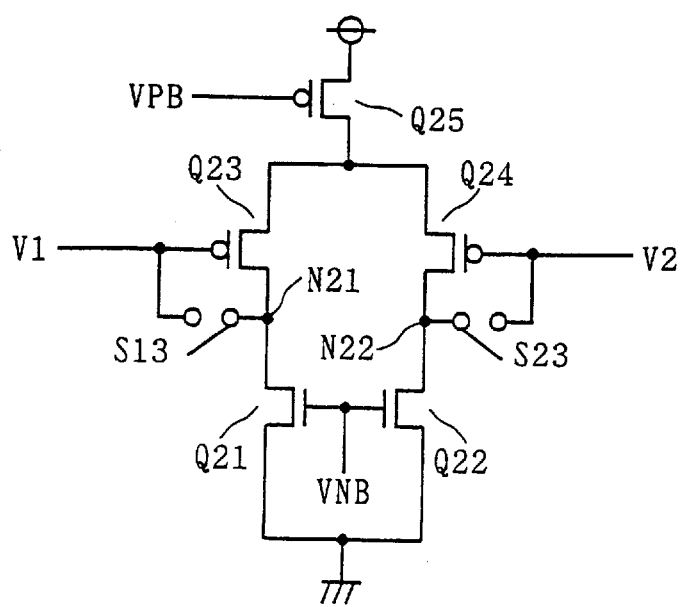
FIG. 42 is a circuit diagram showing an internal configuration of a differential amplifier having a P-type differential pair.
Figure 43:
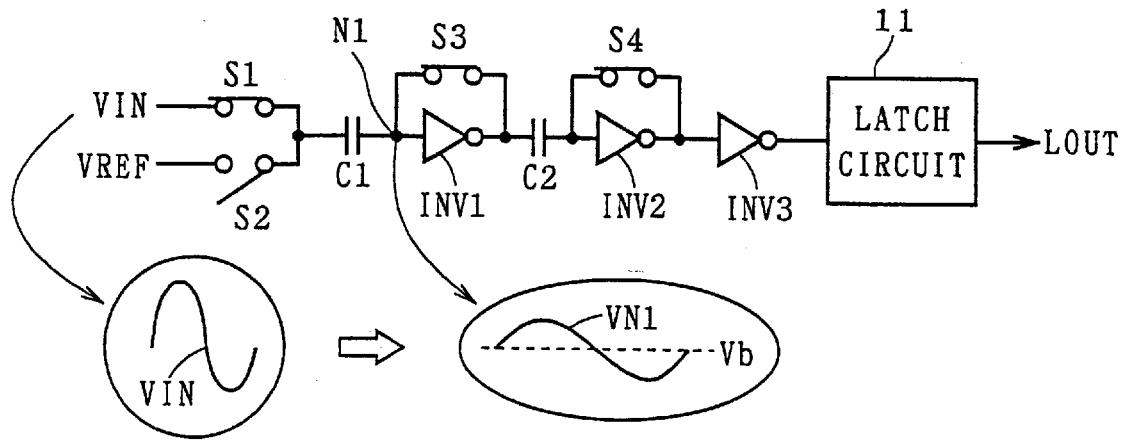
FIG. 43 is an explanation drawing showing a problem caused when the input signal is a high-frequency signal.
Figure 44:
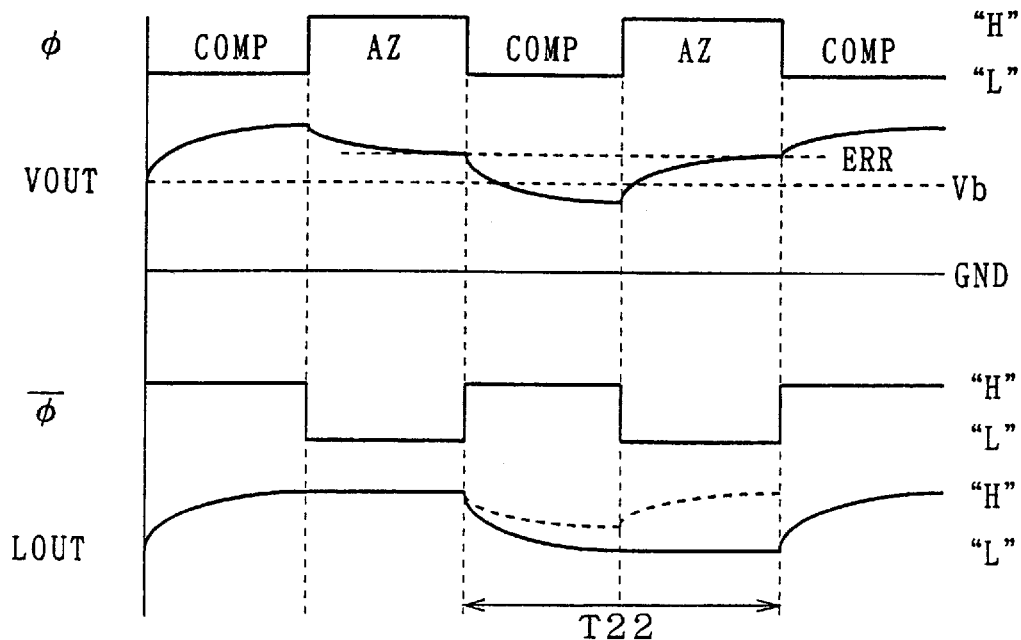
FIG. 44 is a timing diagram showing the operation of the chopper type voltage comparator with the problem shown in FIG. 43.
Figure 45:
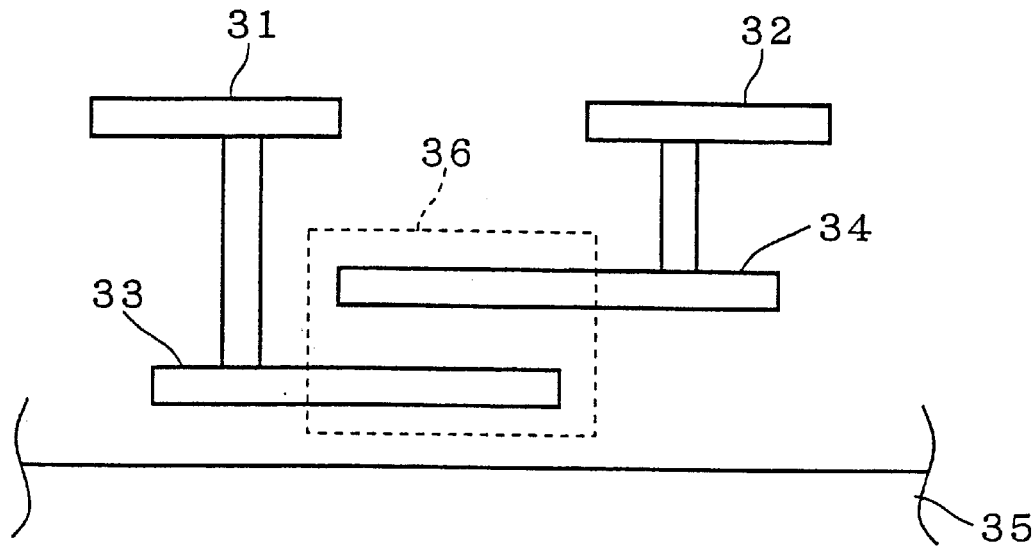
FIG. 45 is an explanation drawing showing a sectional structure of a capacitor having metal electrodes.

In the P-type differential amplifier AMP22, as shown in FIG. 42, the PMOS transistors Q23 and Q24 forming a differential pair are N-type differential amplifiers, and the gate of the PMOS transistor Q23 corresponds to the first input portion, the node N21 to the first output portion, the gate of the PMOS transistor Q24 to the second input portion, and the node N22 to the second output portion.

In the differential amplifier AMP21 including an NMOS differential pair, the AZ level when the first and second inputs and outputs are shorted is higher than VDD/2. In the differential amplifier AMP22 including a PMOS differential pair, the AZ level when the first and second inputs and outputs are shorted is lower than VDD/2.

Thus, in the chopper type voltage comparator of the twelfth preferred embodiment, the input portions of the N-type differential amplifier AMP21 having a relatively high AZ level are connected to the other electrodes (metal electrodes) of the MOS capacitors C11 and C21 so that the capacitors C11 and C21 can operate in an operating region with small voltage dependence.

Furthermore, since the input portions of the P-type differential amplifier AMP22 with a relatively low AZ level are connected to the other electrodes (the semiconductor electrodes) of the MOS capacitors C13 and C23, the capacitors C13 and C23 can operate in an operating region with mall voltage dependence.

As a result, the chopper type voltage comparator of the twelfth preferred embodiment can perform the voltage comparison very accurately. Accordingly, when a parallel type A/D converter is formed by using the voltage comparator of the twelfth preferred embodiment, the A/D converter provides high accuracy.

In addition, the use of the differential amplifiers further improves the accuracy of the comparison between the reference voltage VREF and the input voltage VIN.

<Application to Inverter Amplifiers>

Figure 24:
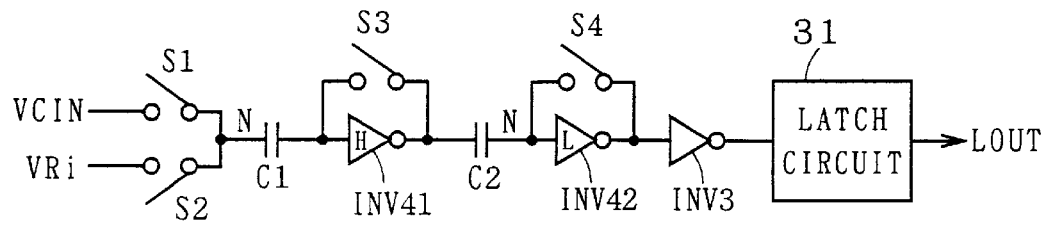
FIG. 24 is a circuit diagram showing another configuration of the chopper type voltage comparator according to the twelfth preferred embodiment of the present invention.

As shown in FIG. 24, an inverter INV41 having an AZ level higher than VDD/2 may be used instead of the differential amplifier AMP21, and an inverter INV42 with an AZ level lower than VDD/2 instead of the differential amplifier AMP22. The same parts as those in FIG. 2 are shown at the same reference characters and not fully described again.

The inverter INV41 with an AZ level higher than VDD/2 can be realized by forming a CMOS inverter with a PMOS transistor having a smaller channel length and a larger channel width than the NMOS transistor, for example. The inverter INV42 having an AZ level lower than VDD/2 can be realized by forming a CMOS inverter with an NMOS transistor having a smaller channel length and a larger channel width than the PMOS transistor, for example.

<<Thirteenth Preferred Embodiment>>

Figure 25:
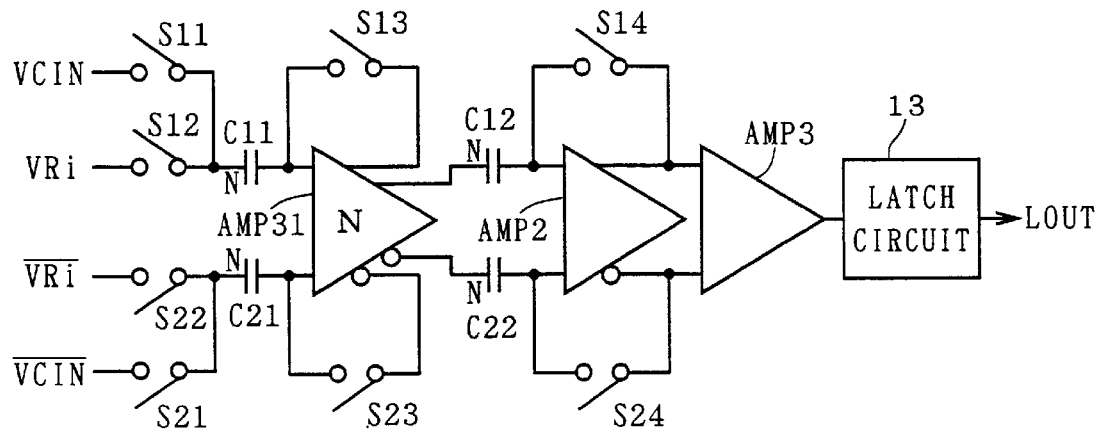
FIG. 25 is a circuit diagram showing a configuration of a chopper type voltage comparator according to a thirteenth preferred embodiment of the present invention.

FIG. 25 is a circuit diagram showing a configuration of a chopper type voltage comparator according to a thirteenth preferred embodiment of the present invention. As shown in this diagram, the conversion input voltage VCIN and the reference voltage Vri are connected to one electrode of the capacitor C11 through the switches S11 and S12, respectively. The other electrode of the capacitor C11 is connected to the first input portion of an N-type differential amplifier AMP31. The external first output portion of the differential amplifier AMP31 is connected to one electrode of the capacitor C12 and the internal first output is fed back to the first input through the switch S13.

The inverse input voltage $\overline{VCIN}$ and the inverse reference voltage $\overline{VRi}$ respectively in the opposite phases to the conversion input voltage VCIN and the reference voltage Vri are connected to one electrode of the capacitor C21 through the switches S21 and S22, respectively. The other electrode of the capacitor C21 is connected to the second input portion of the differential amplifier AMP31. The external second output portion of the differential amplifier AMP31 is connected to one electrode of the capacitor C22 and the internal second output portion is fed back to the second input through the switch S23. The reference voltage Vri and the conversion input voltage VCIN are provided from a converting circuit equivalent to the external input converting portion shown in FIG. 10. The same parts as those in FIG. 18 are shown at the same reference characters and not fully described again.

Figure 26:
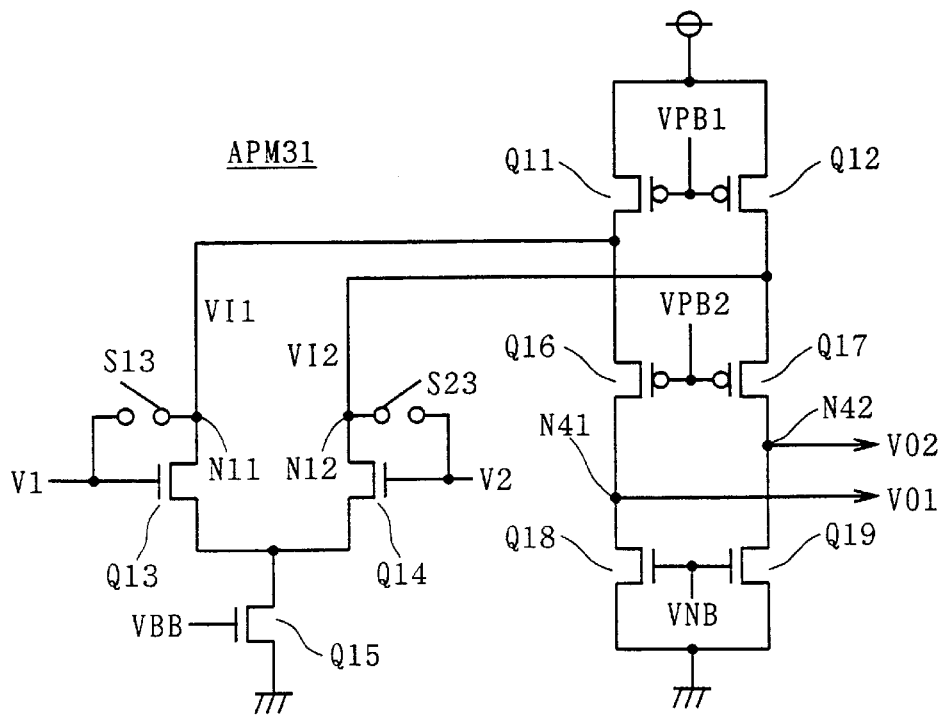
FIG. 26 is a circuit diagram showing an internal configuration of the differential amplifier in the first stage in FIG. 25.

FIG. 26 is a circuit diagram showing an internal configuration of the differential amplifier AMP31 of the folded cascode type. As shown in this diagram, the PMOS transistors Q11 and Q12 receiving the power-supply voltage VDD at their respective sources in common and receiving a constant voltage VPB1 at their respective gates in common are connected to the drains of the NMOS transistors Q13 and Q14 through the nodes N11 and N12, respectively. The NMOS transistor Q13 and the NMOS transistor Q14 form a differential pair. The gate of the NMOS transistor Q13 receives the first voltage V1 and the gate of the NMOS transistor Q14 receives the second voltage V2. The sources of the NMOS transistors Q13 and Q14 are grounded in common through the NMOS transistor Q15 receiving the constant voltage VBB at its gate. The drain (node N11) of the NMOS transistor Q13 and its gate are connected through the switch S13 and the drain (node N12) and the gate of the NMOS transistor Q14 are connected through the switch S23.

The drains of the PMOS transistors Q11 and Q12 are also connected to the sources of PMOS transistors Q16 and Q17, respectively. The gates of the PMOS transistors Q16 and Q17 receive a constant voltage VPB2 in common and the sources are connected to the drains of NMOS transistors Q18 and Q19 through nodes N41 and N42, respectively. The gates of the NMOS transistors Q18 and Q19 receive a constant voltage VNB in common and the sources are grounded in common.

In the differential amplifier AMP31 having this configuration, the gate of the NMOS transistor Q13 corresponds to the first input portion, the node N11 to the internal first output portion, the gate of the NMOS transistor Q14 to the second input portion, the node N12 to the internal second output portion, the node N41 to the external first output portion, and the node N42 to the external second output portion.

Accordingly, the external output signals VO1 and VO2 obtained from the nodes N41 and N42, which are obtained as the internal output signals VI1 and VI2 obtained from the nodes N11 and N12 pass through the PMOS transistors Q16 and Q17, are downwardly shifted signals.

That is to say, it can be said that the differential amplifier AMP31 is formed of a differential amplification portion including the transistors Q11–Q15 and a level shift portion including the transistors Q16–Q19.

Thus, in the chopper type voltage comparator of the thirteenth preferred embodiment, the voltage VC (the reference voltage Vri and the conversion input voltage VCIN) provided to one electrode (the semiconductor electrode) of the capacitor C11 and one electrode of the capacitor C21 are suppressed to VDD/2 or lower, so that the capacitor C11 and capacitor C21 can operate in an operating region with relatively small voltage dependence.

Furthermore, the voltage provided to one electrode (the semiconductor electrode) of the capacitor C12 and the capacitor C22 is suppressed low by the level shift portion in the differential amplifier AMP31 so that the capacitors C12 and C22 in the voltage comparator can operate in an operating region with small voltage dependence.

As a result, the chopper type voltage comparator of the thirteenth preferred embodiment can accurately perform the voltage comparison. Accordingly, when a parallel type A/D converter is formed as shown in FIG. 10 by using the voltage comparator of the thirteenth preferred embodiment, the A/D converter provides high accuracy.

In addition, the use of the differential amplifiers further improves the accuracy of the comparison between the reference voltage Vri and the conversion input voltage VCIN.

Figure 27:
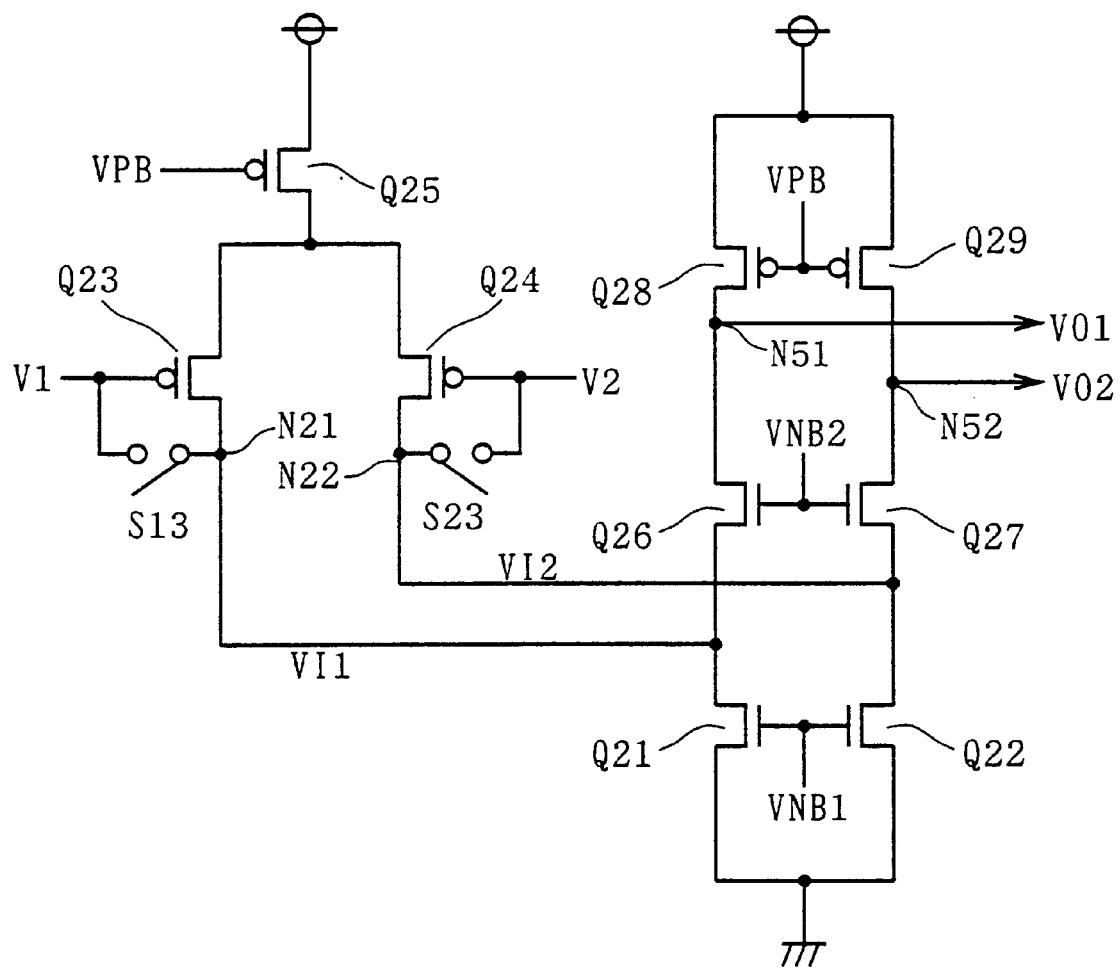
FIG. 27 is a circuit diagram showing another internal configuration of the differential amplifier in the first stage in FIG. 25.

FIG. 27 is a circuit diagram showing an internal configuration of the differential amplifier AMP31 in the case in which it includes a P-type differential pair. As shown in this diagram, NMOS transistors Q21 and Q22 having their respective sources grounded in common and receiving a constant voltage VNB1 at their respective gates in common are connected to drains of PMOS transistors Q23 and Q24 through nodes N21 and N22, respectively. The PMOS transistor Q23 and the PMOS transistor Q24 from a differential pair, which receives the first voltage V1 at the gate of the PMOS transistor Q23 and receives the second voltage V2 at the gate of the PMOS transistor Q24. The sources of the PMOS transistors Q23 and Q24 are connected to the power supply VDD in common through a PMOS transistor Q25 receiving a constant voltage VPB at its gate. The drain (the node N21) and the gate of the PMOS transistor Q23 are connected through the switch S13 and the drain (the node N22) and the gate of the PMOS transistor Q24 are connected through the switch S23.

The drains of the NMOS transistors Q21 and Q22 are connected also to sources of NMOS transistors Q26 and Q27, respectively. The gates of the NMOS transistors Q26 and Q27 receive the constant voltage VNB2 in common and the sources are connected to drains of PMOS transistors Q28 and Q29 through nodes N51 and N52. The gates of the PMOS transistors Q28 and Q29 receive a constant voltage VPB in common and the sources are connected to the power supply VDD in common.

In the differential amplifier AMP31 having this configuration, the gate of the PMOS transistor Q23 serves as the first input portion, the node N21 as the internal first output portion, the gate of the PMOS transistor Q24 as the second input portion, the node N22 as the internal second output portion, the node N51 as the external first output portion and the node N52 as the external second output portion.

Accordingly, the internal output signals VI1 and VI2 obtained from the nodes N21 and N22 pass through the NMOS transistors Q26 and Q27 to make the external output signals VO1 and VO2 from the nodes N51 and N52, which are upwardly level-shifted signals.

That is to say, it can be said that the differential amplifier AMP31 having the configuration shown in FIG. 27 is formed of a differential amplification portion including the transistors Q21–Q25 and a level shift portion including the transistors Q26–Q29.

This P-type differential amplifier AMP31 is used when the capacitors C12 and C22 each have its one electrode (semiconductor electrode) of P type.

<<Fourteenth Preferred Embodiment>>

Figure 28:
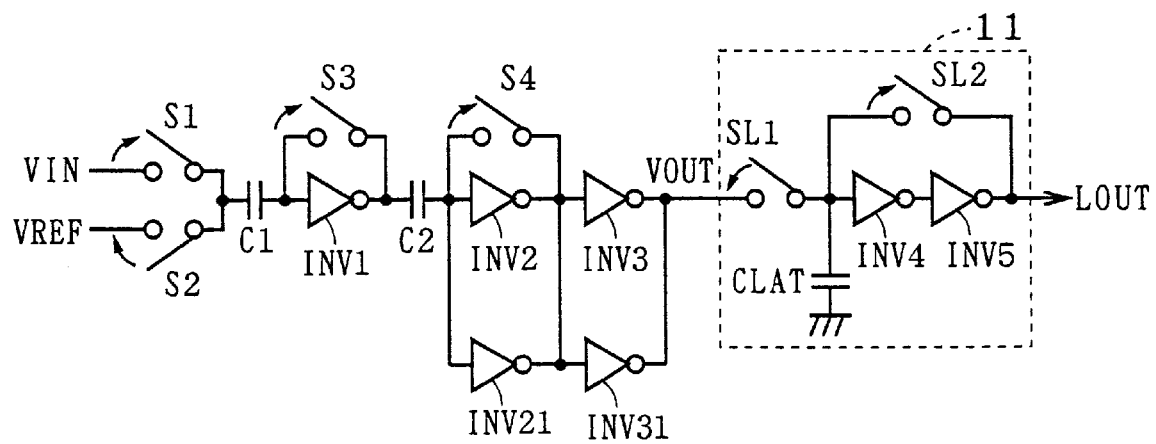
FIG. 28 is a circuit diagram showing a configuration of a chopper type voltage comparator according to a fourteenth preferred embodiment of the present invention.

FIG. 28 is a circuit diagram showing a configuration of a chopper type voltage comparator according to a fourteenth preferred embodiment of the present invention. The same parts as those in FIG. 2 are shown at the same reference characters and not fully explained again. As shown in this diagram, the latch circuit 11 is formed of inverters INV4 and INV5 connected in series and switches SL1 and SL2, wherein the switch SL1 is provided between the output portion of the inverter INV3 and the input portion of the inverter INV4, and the output portion of the inverter INV5 and the input portion of the inverter INV4 are connected through the switch SL2. The switch SL1 is driven in the same phase as the switch S2 and the switch SL2 is driven in the same phase as the switches S1, S3 and S4.

On the other hand, an inverter INV21 and an inverter INV31 are connected in parallel, between the input portion of the inverter INV2 and the output portion of the inverter INV3. That is to say, the input portion of the inverter INV21 is connected to the input portion of the inverter INV2 and the output portion of the inverter INV31 is connected to the output portion of the inverter INV3. The output portion of the inverter INV21 is also connected to the output portion of the inverter INV2.

Note that the input/output characteristics of the inverters INV2–INV5, the inverters INV21, INV31 are set equal.

Thus, the chopper type voltage comparator of the fourteenth preferred embodiment is provided with the inverter INV21 and the inverter INV31 to enlarge the driving capability of the output voltage VOUT to the latch circuit 11. This reduces the effect of the parasitic capacitance appendant to the input portion of the latch circuit 11, so that the previously held data does not prevent the voltage change toward "H" or "L" of the next captured input data, which certainly prevents malfunction.

Furthermore, since the input/output characteristics of the inverters INV2–INV5, the inverters INV21, INV31 are set equal, there is no mismatch in the input/output characteristics of the inverter INV3 and the inverter INV31 and the inverter INV4 in the latch circuit 11. Hence, the addition of the inverters INV21 and INV31 causes no adverse influence.

Figure 29:
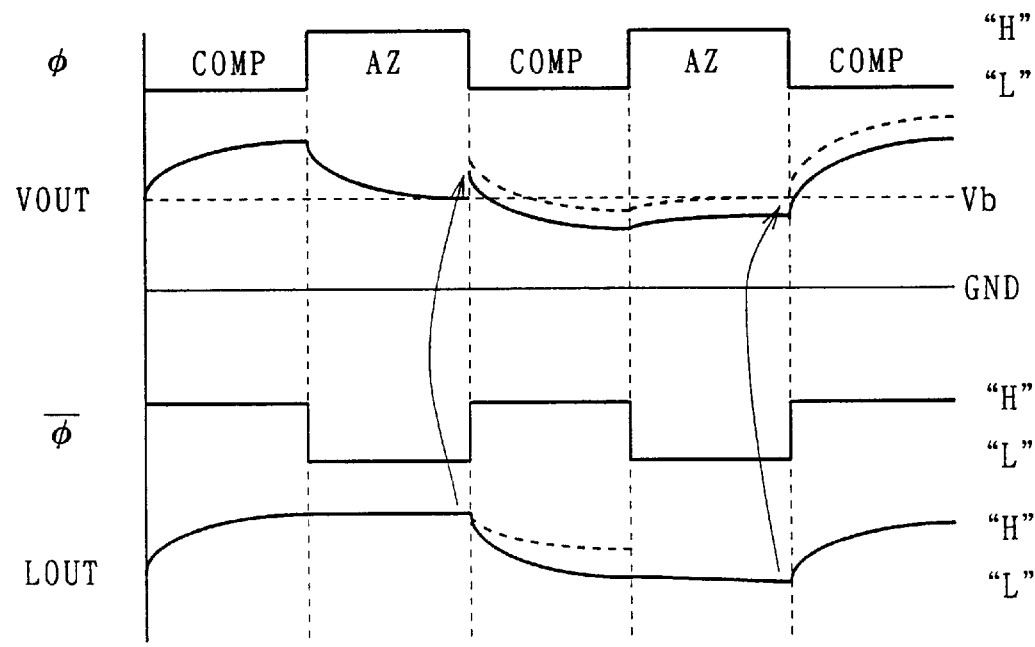
FIG. 29 is a timing diagram showing the operation of the fourteenth preferred embodiment.
Figure 30:
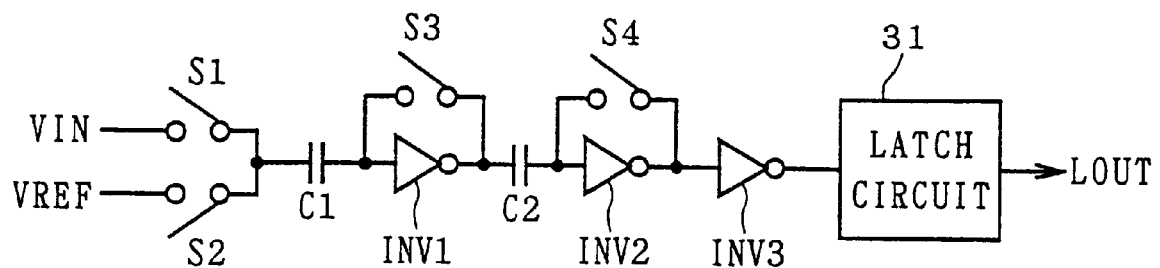
FIG. 30 is a circuit diagram showing a configuration of a conventional chopper type voltage comparator.

FIG. 29 is a timing diagram showing the operation of the chopper type voltage comparator. As shown in this diagram, it correctly operates while less affected by kickback from the latch circuit 11. The dotted lines show an operation of a conventional configuration largely affected by the kickback.

As a result, the chopper type voltage comparator of the fourteenth preferred embodiment can perform highly accurate voltage comparison. Accordingly, when a parallel type A/D converter is formed by using the voltage comparator of the fourteenth preferred embodiment, the A/D converter provides high accuracy.

While the invention has been described in detail, the foregoing description is in all aspects illustrative and not restrictive. It is understood that numerous other modifications and variations can be devised without departing from the scope of the invention.

We claim:

1. A voltage comparator, comprising:

a first capacitor having a first electrode receiving a first voltage in a first period and receiving a second voltage in a second period;

a first inverting amplifier having its input portion connected to a second electrode of said first capacitor and set to a first bias voltage in said first period, for inversely amplifying a signal received at the input portion in said second period to output a first amplification signal;

an output-providing inverting amplifier for amplifying a signal related to said first amplification signal to output an amplification output signal; and bias voltage assisting means provided separately from said first inverting amplifier, for providing an auxiliary voltage at the same level as said first bias voltage to the input portion of said first inverting amplifier in said first period.

2. The voltage comparator according to claim 1, wherein said first inverting amplifier is shorted between its input and output and its input portion is set to said first bias voltage in said first period, and said bias voltage assisting means includes an auxiliary inverting amplifier connected in parallel to said first inverting amplifier and having the same input/output characteristic as said first inverting amplifier, wherein said auxiliary inverting amplifier is shorted between its input and output and its input portion is set to said auxiliary voltage in said first period.

3. The voltage comparator according to claim 2, wherein said output-providing inverting amplifier has its input portion connected to the output portion of said first inverting amplifier and said signal related to said first amplification signal includes said first amplification signal itself, wherein said first inverting amplifier, said auxiliary inverting amplifier and said output-providing inverting amplifier have the same input/output characteristic.

4. The voltage comparator according to claim 2, further comprising, a second capacitor having its first electrode connected to the output portion of said first inverting amplifier, and a second inverting amplifier having its input portion connected to a second electrode of said second capacitor and its output portion connected to the input portion of said output-providing inverting amplifier, wherein the input and output portions of said second inverting amplifier are shorted and the input portion is set to a second bias voltage in said first period, and said second inverting amplifier amplifies a signal obtained from the input portion in said second period to output a second amplification signal, and wherein said signal related to said first amplification signal includes said second amplification signal.

5. The voltage comparator according to claim 1, wherein said bias voltage assisting means includes bias voltage supply means for supplying said first bias voltage to the input portion of said first inverting amplifier in said first period.

6. The voltage comparator according to claim 1, wherein the input portion of said first inverting amplifier includes first and second differential input portions, its output portion includes first and second differential output portions, and said first amplification signal includes first and second differential amplification signals that are in opposite phases to each other, wherein said first inverting amplifier amplifies a potential difference between signals obtained from said first and second differential input portions to output said first and second differential amplification signals from said first and second differential output portions, respectively, and said first capacitor includes first and second differential capacitors, one of said first and second differential capacitors receiving at its first electrode said first voltage in said first period and said second voltage in said second period, wherein said first differential input portion of said first inverting amplifier is connected to a second electrode of said first differential capacitor and said second differential input portion of said first inverting amplifier is connected to a second electrode of said second differential capacitor.

7. A voltage comparator for voltage-comparing first and second voltages to output the result of the voltage comparison, comprising:

a first capacitor having first and second electrodes, one of which is an impurity semiconductor electrode and the other of which is a polysilicon or metal electrode, said first electrode of said first capacitor receiving a first related voltage in a first period and receiving a second related voltage in a second period;

a first inverting amplifier having an input portion connected to the second electrode of said first capacitor, the input portion of said first inverting amplifier being set to a first bias voltage in said first period, said first inverting amplifier inversely amplifying a signal received from the input portion in said second period to output a first amplification signal;

an output-providing inverting amplifier for amplifying a signal related to said first amplification signal to output an amplification output signal as said voltage comparison result; and first capacitor voltage control means provided on the side of the first or second electrode of said first capacitor, for voltage-controlling the first or second electrode side of said first capacitor so that said first capacitor operates in an operating region where its capacitance value has small voltage dependence.

8. The voltage comparator according to claim 7, wherein said first capacitor voltage control means includes first level converting means receiving said first and second voltages for converting said first and second voltages to provide said first and second related voltages to the first electrode of said first capacitor, respectively, wherein said first and second related voltages are at a level so that said first capacitor operates in an operating region in which its capacitance value has small voltage dependence when the voltage at the second electrode of said first capacitor is at said first bias voltage.

9. The voltage comparator according to claim 7, wherein said first capacitor voltage control means including;

capacitor bias voltage supply means for supplying a capacitor bias voltage to the second electrode of said first capacitor in said first period, said capacitor bias voltage being at a level so that said first capacitor operates in an operating region in which its capacitance value has small voltage dependence when the first electrode of said first capacitor is at said first or second related voltage, and first level converting means for level-converting a voltage obtained from the second electrode of said first capacitor and providing the converted voltage to the input portion of said first inverting amplifier, wherein said first level converting means level-converts said capacitor bias voltage to said first bias voltage in said first period.

10. The voltage comparator according to claim 9, wherein said capacitor bias voltage supply means including;

first comparison voltage generating means for generating a fixed first comparison voltage, second level converting means for level-converting said capacitor bias voltage to provide a second comparison voltage, and voltage comparing means for comparing said first and second comparison voltages to output said capacitor bias voltage on the basis of a result of the comparison, wherein said first comparison voltage is equal to said first bias voltage and said second level converting means has the same converting characteristic as said first level converting means.

11. The voltage comparator according to claim 7, wherein the input portion of said first inverting amplifier includes first and second differential input portions, its output portion includes first and second differential output portions, and said first amplification signal includes first and second differential amplification signals that are in opposite phases to each other, wherein said first inverting amplifier amplifies a potential difference between signals obtained from said first and second differential input portions to output said first and second differential amplification signals from said first and second differential output portions, respectively, and said first capacitor includes first and second differential capacitors, one of said first and second differential capacitors receiving at its first electrode said first related voltage in said first period and said second related voltage in said second period, wherein said first differential input portion of said first inverting amplifier is connected to a second electrode of said first differential capacitor and said second differential input portion of said first inverting amplifier is connected to a second electrode of said second differential capacitor.

12. The voltage comparator according to claim 7, further comprising, a second capacitor having first and second electrodes, one of which is an impurity semiconductor electrode and the other is a polysilicon or metal electrode, said first electrode being disposed on the side of an output portion of said first inverting amplifier, a second inverting amplifier having its input portion connected to the second electrode of said second capacitor and its output portion connected to an input portion of said output-providing inverting amplifier, the input portion of said second inverting amplifier being set to a second bias voltage attaining a good gain characteristic in said first period, said second inverting amplifier inversely amplifying a signal received at the input portion in said second period to output a second amplification signal, said signal related to said first amplification signal including said second amplification signal, and second capacitor voltage control means provided on the side of the first or second electrode of said second capacitor, for voltage-controlling the first or second electrode of said second capacitor so that said second capacitor operates in an operating region in which its capacitance value has small voltage dependence.

13. The voltage comparator according to claim 12, wherein said second capacitor voltage control means includes first level converting means for level converting said first amplification signal to provide a first level conversion voltage to the first electrode of said second capacitor, wherein said first level conversion voltage is at a level so that said second capacitor operates in an operating region in which its capacitance value has small voltage dependence when the voltage at the second electrode of said second capacitor is at said second bias voltage.

14. The voltage comparator according to claim 12, wherein said first bias voltage of said first inverting amplifier is at a level so that said first capacitor operates in an operating region in which its capacitance value has small voltage dependence when the first electrode of said first capacitor is at said first or second related voltage, and said second bias voltage of said second inverting amplifier is at a level so that said second capacitor operates in an operating region in which its capacitance value has small voltage dependence when the first electrode of said second capacitor is at said second bias voltage, and wherein said first inverting amplifier includes said first capacitor voltage control means provided on the side of the second electrode of said first capacitor, and said second inverting amplifier includes said second capacitor voltage control means provided on the side of the second electrode of said second capacitor.

15. The voltage comparator according to claim 12, wherein said first inverting amplifier includes, an amplification portion for inversely amplifying a signal received from its input portion in said second period to output an internal amplification signal, and a level converting portion for level-converting said internal amplification signal to output said first amplification signal, wherein said first amplification signal is at a level so that said second capacitor operates in an operating region in which its capacitance value has small voltage dependence when the second electrode of said second capacitor is at said second bias voltage, and wherein said second capacitor voltage control means is provided on the side of the first electrode of said second capacitor and shares said level converting portion.

16. A voltage comparator, comprising:

a first capacitor having a first electrode receiving a first voltage in a first period and receiving a second voltage in a second period;

a first inverting amplifier having its input portion connected to the side of a second electrode of said first capacitor, the input portion of said first inverting amplifier being set to a first bias voltage in said first period, said first inverting amplifier inversely amplifying a signal received from the input portion in said second period to output a first amplification signal;

an output-providing inverting amplifier for amplifying a signal related to said first amplification signal to output an amplification output signal; and latch means having an input portion and an output portion, receiving said amplification output signal at the input portion as latch data in said second period, and feeding back a signal obtained from the output portion to the input portion without receiving said amplification output signal at said input portion and holding said latch data in said first period;

wherein said output-providing inverting amplifier has a driving capability set to such a level as to be unaffected by the capacitance attendant on said input portion of said latch means.

17. The voltage comparator according to claim 16, further comprising, a second capacitor having its first electrode connected to an output portion of said first inverting amplifier, and a second inverting amplifier having its input portion connected to a second electrode of said second capacitor and its output portion connected to an input portion of said output-providing inverting amplifier, wherein the input portion of said second inverting amplifier is set to a second bias voltage in said first period and said second inverting amplifier amplifies a signal obtained from the input portion in the second period to output a second amplification signal, wherein said latch means includes first and second inverters connected in series from the input portion to the output portion, said second inverting amplifier includes third and fourth inverters connected in parallel between the input and output portions, and said output-providing inverting amplifier includes fifth and sixth inverters connected in parallel between the input and output portions, and wherein said first to sixth inverters have input/output characteristics set equal.

18. An A/D converter, comprising:

a plurality of voltage comparators as recited in claim 1, input voltage providing means for providing an analog input voltage to said plurality of voltage comparators in common as said first voltage;

reference voltage providing means for providing a plurality of different reference voltages to said plurality of voltage comparators, respectively, as said second voltage; and encode means for encoding signals related to said amplification output signal from said plurality of voltage comparators to output a digital signal.

19. An A/D converter, comprising:

a plurality of voltage comparators as recited in claim 7, input voltage providing means for providing an analog input voltage to said plurality of voltage comparators in common as said first voltage;

reference voltage providing means for providing a plurality of different reference voltages to said plurality of voltage comparators, respectively, as said second voltage; and encode means for encoding signals related to amplification output signal from said plurality of voltage comparators to output a digital signal.

20. An A/D converter, comprising:

a plurality of voltage comparators as recited in claim 16, input voltage providing means for providing an analog input voltage to said plurality of voltage comparators in common as said first voltage;

reference voltage providing means for providing a plurality of different reference voltages to said plurality of voltage comparators, respectively, as said second voltage; and encode means for encoding signals related to said amplification output signal from said plurality of voltage comparators to output a digital signal.

\* \* \* \* \*